(12) United States Patent
Sonoda et al.

(10) Patent No.: US 10,026,481 B2
(45) Date of Patent: Jul. 17, 2018

(54) SEMICONDUCTOR DEVICE

(71) Applicant: Renesas Electronics Corporation, Tokyo (JP)

(72) Inventors: Kenichiro Sonoda, Tokyo (JP); Eiji Tsukuda, Tokyo (JP); Keiichi Maekawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/597,294

(22) Filed: May 17, 2017

(65) Prior Publication Data

US 2018/0040379 A1 Feb. 8, 2018

(30) Foreign Application Priority Data

Aug. 5, 2016 (JP) ................................. 2016-154630

(51) Int. Cl.
| | |
|---|---|
| G11C 16/08 | (2006.01) |
| G11C 16/10 | (2006.01) |
| H01L 27/11568 | (2017.01) |
| H01L 27/11573 | (2017.01) |
| H01L 29/06 | (2006.01) |
| H01L 29/792 | (2006.01) |
| G11C 16/04 | (2006.01) |

(Continued)

(52) U.S. Cl.
CPC .......... *G11C 16/10* (2013.01); *G11C 16/0466* (2013.01); *G11C 16/08* (2013.01); *G11C 16/26* (2013.01); *G11C 16/3459* (2013.01); *H01L 27/11568* (2013.01); *H01L 27/11573* (2013.01); *H01L 29/0649* (2013.01); *H01L 29/792* (2013.01); *G11C 16/3418* (2013.01)

(58) Field of Classification Search
CPC ..... G11C 16/10; G11C 16/0466; G11C 16/08; G11C 16/26; G11C 16/3418; G11C 16/3459; H01L 27/11568; H01L 29/0649; H01L 29/792
USPC ............. 365/185.18, 185.17, 185.23, 185.28
See application file for complete search history.

(56) References Cited

U.S. PATENT DOCUMENTS

| | | | |
|---|---|---|---|
| 6,181,599 B1 * | 1/2001 | Gongwer | G11C 8/08 365/185.18 |
| 2010/0067297 A1 * | 3/2010 | Chae | G11C 8/08 365/185.11 |
| 2015/0137239 A1 | 5/2015 | Shinohara et al. | |

FOREIGN PATENT DOCUMENTS

JP 2015-103555 A 6/2015

* cited by examiner

*Primary Examiner* — Tan T. Nguyen
(74) *Attorney, Agent, or Firm* — Mattingly & Malur, PC

(57) ABSTRACT

A semiconductor device is provided that is capable of reducing the possibility of change in state of memory elements formed over a semiconductor substrate with an insulating layer interposed therebetween. The semiconductor device includes nonvolatile memory elements and a bias circuit. Each of the nonvolatile memory elements includes a drain region and a source region arranged so as to sandwich a semiconductor region where a channel is formed, a gate electrode, and a charge storage layer arranged between the gate electrode and the semiconductor region. The nonvolatile memory elements are arranged over the semiconductor substrate with the insulating layer interposed therebetween. When electrons are stored in the charge storage layer, the bias circuit reduces the potential difference between the gate electrode and at least one of the drain region and source region in order to decrease holes stored in the channel of a nonvolatile memory element.

16 Claims, 8 Drawing Sheets

(51) Int. Cl.
*G11C 16/26* (2006.01)
*G11C 16/34* (2006.01)

FIG. 4
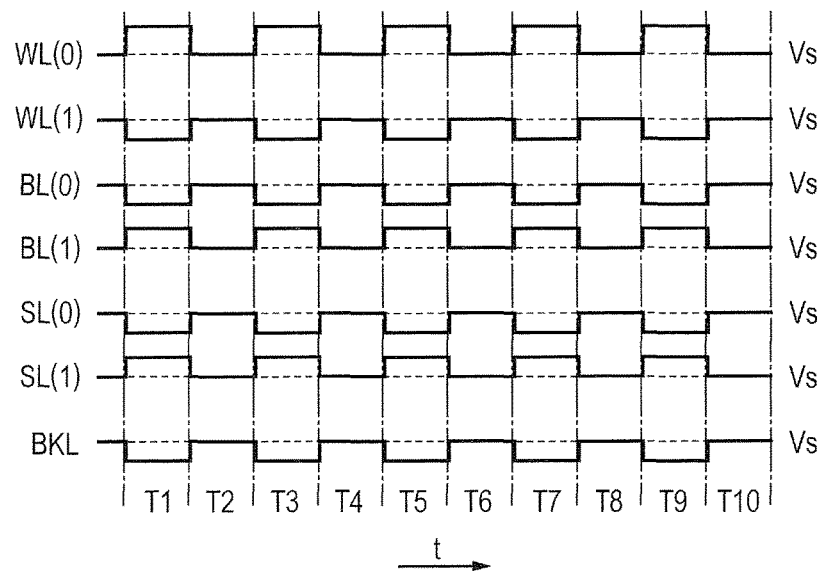
FIG. 5(A)
FIG. 5(B)
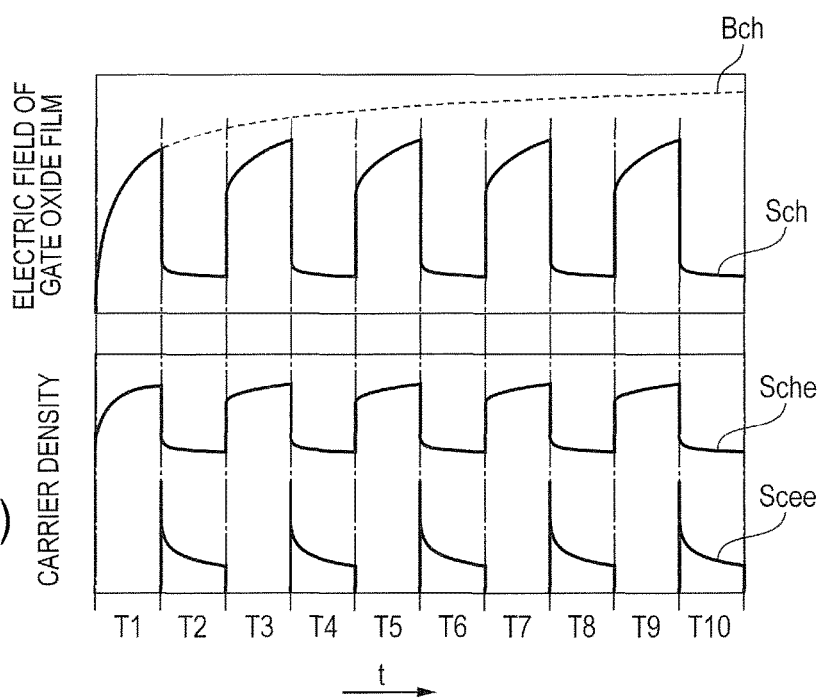

SEMICONDUCTOR DEVICE

CROSS-REFERENCE TO RELATED APPLICATIONS

The disclosure of Japanese Patent Application No. 2016-154630 filed on Aug. 5, 2016 including the specification, drawings and abstract is incorporated herein by reference in its entirety.

BACKGROUND

This invention relates to semiconductor devices, and more particularly to a semiconductor device including electrically-rewritable nonvolatile memory elements formed over a semiconductor substrate with an insulating layer interposed therebetween.

A semiconductor device equipped with an electrically-rewritable nonvolatile memory, such as a so-called EEPROM and flash memory, is disclosed in, for example, Japanese Unexamined Patent Application Publication No. 2015-103555. In the Japanese Unexamined Patent Application Publication No. 2015-103555, metal oxide nitride oxide semiconductor (MONOS) transistors are employed as memory cells (hereinafter, referred to as nonvolatile memory elements or simply, memory elements) that make up the EEPROM or flash memory. It is described that such an EEPROM or flash memory can be written and erased using Fowler-Nordheim tunneling phenomenon, hot electrons, or hot holes.

In addition, the Japanese Unexamined Patent Application Publication No. 2015-103555 discloses silicon-on-thin-buried-oxide (SOTB) transistors formed over a silicon-on-insulator (SOI) substrate.

SUMMARY

The inventors of the present invention have devised a memory element configured like the MONOS transistor formed over a SOI substrate in a similar manner as the SOTB transistor. The resultant product has an insulating layer between the semiconductor substrate and the memory element, thereby decreasing the parasitic capacitance of the semiconductor substrate, which is inherent in the memory element. Consequently, the memory element can provide, for example, improved operational speed.

The inventor fabricated memory elements over a SOI substrate in the same manner as the SOTB transistors, and performed evaluations on the memory elements during write operation. However, the evaluation results showed that the memory elements had a relatively short erroneous erase lifetime in comparison with memory elements formed over a semiconductor substrate. Specifically, the evaluations found a new problem that the erroneous erase lifetime, which is a period up to when a written memory element is determined to be erased, is very short in comparison with the memory elements formed over the semiconductor substrate. This new problem is not disclosed in the aforementioned Japanese Unexamined Patent Application Publication No. 2015-103555.

Other problems and novel features of the present invention will become apparent from the following description in the specification and the accompanying drawings.

The semiconductor device according to an embodiment includes a plurality of memory elements and a bias circuit. Each of the memory elements includes a pair of second semiconductor regions arranged to sandwich a first semiconductor region where a channel is formed, the second semiconductor regions being of a first conductivity type, a gate electrode arranged above the first semiconductor region, and a charge storage layer arranged between the gate electrode and the first semiconductor region and storing charge. The memory elements are arranged over a semiconductor substrate with an insulating layer interposed therebetween. When majority charge carriers of the first conductivity type are stored in the charge storage layer of a first memory element in the memory elements, the bias circuit reduces the potential difference between the gate electrode of a second memory element, which is different from the first memory element, and at least one of the second semiconductor regions to thereby reduce majority charge carrier of a second conductivity type, which is different from the first conductivity type, stored in the channel of the second memory element.

This embodiment can provide a semiconductor device capable of reducing the possibility of change in state of the memory elements formed over the semiconductor substrate with the insulating layer interposed therebetween.

BRIEF DESCRIPTION OF THE DRAWINGS

FIG. 4 is a waveform diagram showing waveforms during a write operation performed on the flash memory according to the first embodiment.

FIGS. 5A and 5B are characteristic diagrams, respectively showing the electric field variations of an unselected memory element according to the first embodiment, and the charge variations of the unselected memory element.

DETAILED DESCRIPTION

Figure 1:
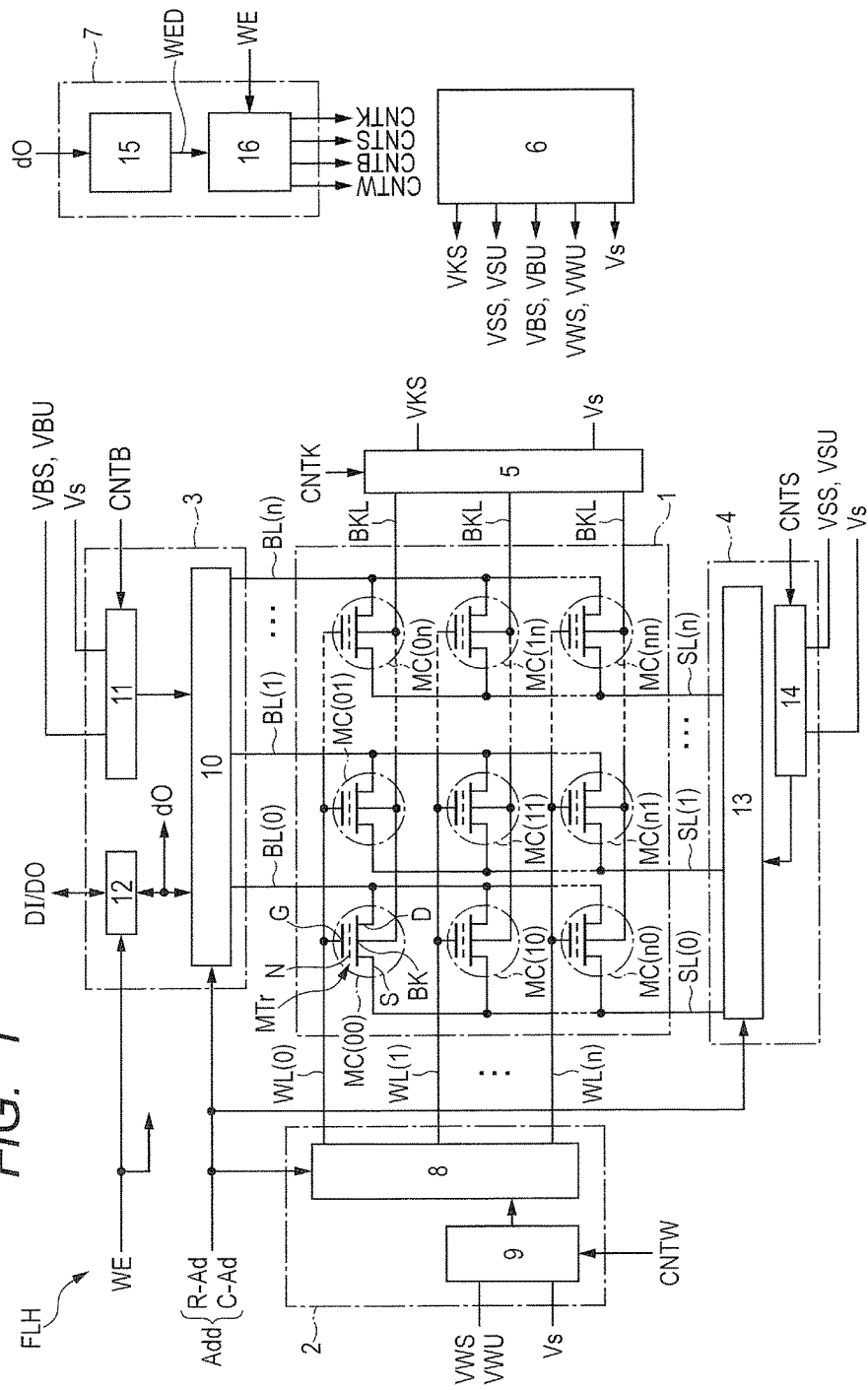
FIG. 1 is a block diagram showing the configuration of a flash memory according to the first embodiment.

With reference to the accompanying drawings, embodiments of the present invention will be described below. In all the drawings to describe the embodiments, the same reference numerals and letters are assigned to the same components in principle, and explanations thereof will not be repeated.

First Embodiment

In order to make it easier to understand the embodiments, firstly, description will be made about a new problem arising when memory elements are formed over a semiconductor substrate with an insulating layer interposed therebetween.

New Problem

Figure 10:
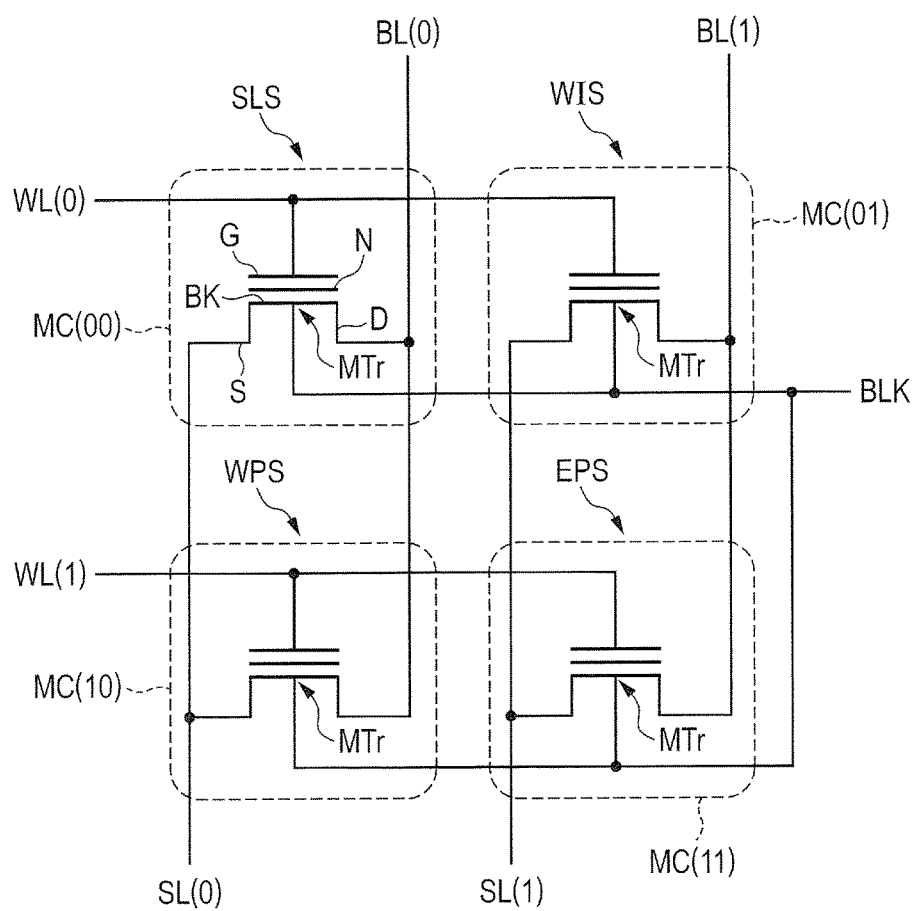
FIG. 10 is a circuit diagram to describe a new problem found by the inventors of the present invention.

FIG. 10 is a circuit diagram to describe the new problem found by the inventors of the present invention. A plurality of memory elements are arranged in a matrix, and each of the memory elements are formed over a semiconductor substrate with an insulating layer interposed therebetween. In plan view, the memory elements are arranged in a matrix over the insulating layer, and the semiconductor substrate is arranged below the insulating layer. FIG. 10 shows four memory elements numbered MC (00) to MC (11) among the memory elements arranged in a matrix. In FIG. 10, for example, the memory elements MC (00) and MC (01) are aligned along the 0 th row of the matrix, while the memory elements MC (10) and MC (11) are aligned along the 1st row of the matrix. When viewed along columns in the matrix, the memory elements MC (00) and MC (10) are aligned along the 0 th column, while the memory elements MC (01) and MC (11) are aligned along the 1st column.

Each of the memory elements MC (00) to MC (11) includes a MONOS transistor MTr. Since all the memory elements MC (00) to MC (11) have the same structure, the explanation of the structure will be made using the memory element MC (00) as an example. The MONOS transistor MTr making up the memory element MC (00) includes a source region S, a drain region D, a gate electrode G, and a back gate BK. In addition, N in FIG. 10 denotes a charge storage layer in which charge is stored. The gate electrode G of the MONOS transistor is coupled to a word line WL (0) arranged along the 0 th row of the matrix, the source region S is coupled to a source line SL (0) arranged along the 0 th column of the matrix, and the drain region D is coupled to a bit line BL (0) arranged along the 0 th column of the matrix. The back gate BK is coupled to a back gate line BKL.

The MONOS transistor MTr described herein is an N-channel transistor, but this is just an example. Accordingly, a pair of N-type semiconductor regions are arranged so as to sandwich a P-type semiconductor region formed over the insulating layer. One of the N-type semiconductor regions serves as the drain region D and is coupled to the bit line BL (0), and the other serves as the source region S and is coupled to the source line SL (0). Over a main surface of the P-type semiconductor region sandwiched by the N-type semiconductor regions formed is a gate insulating layer, and the charge storage layer N is formed over the gate insulating layer. The charge storage layer N is made of, for example, a nitride film, and a conductive layer making up the gate electrode G is formed above the charge storage layer N made of the nitride film. An insulating layer is interposed between the charge storage layer N and the conductive layer. In short, an insulating layer, nitride film, insulating layer, and conductive layer are stacked on the upper side of the P-type semiconductor region.

For instance, application of a voltage to the gate electrode G creates an electric field that forms a channel in the P-type semiconductor region. The channel is also formed in the P-type semiconductor region with an electric field created by the back gate line BKL. Since the P-type semiconductor region where the channel is formed is thin, the semiconductor substrate located on the opposite side of the P-type semiconductor region with respect to the insulating layer is used as the back gate line BKL. Specifically, the P-type semiconductor region is electrically isolated from the semiconductor substrate by the insulating layer, and is electrically floating; however, application of a voltage to the semiconductor substrate (back gate line BKL) can change the voltage in the P-type semiconductor region.

The voltage to be applied is what determines which of the N-type semiconductor regions included in the MONOS transistor MTr serves as the source region S or drain region D. In this specification, the N-type semiconductor region coupled to the source line SL (0) is assumed as the source region S, and the N-type semiconductor region coupled to the bit line BL (0) is assumed as the drain region D.

The remaining memory elements MC (01) to MC (11) have the same structure as the memory element MC (00); however, they are coupled to different word lines, bit lines, and source lines. Specifically, the MONOS transistor MTr of the memory element MC (01) is coupled to the word line WL (0) in the 0 th row, the bit line BL (1) in the 1st column, and the source line SL (1) in the 1st column. The MONOS transistor MTr of the memory element MC (10) is coupled to the word line WL (1) in the 1st row, the bit line BL (0) in the 0 th column, and the source line SL (0) in the 0 th column. The MONOS transistor MTr of the memory element MC (11) is coupled to the word line WL (1) in the 1st row, the bit line BL (1) in the 1st column, and the source line SL (1) in the 1st column.

The memory elements MC (00) to MC (11) are memory elements of a so-called flash memory. Data is written to or erased from a desired memory element (MONOS transistor MTr) by selecting a word line, bit line, and source line coupled to the desired memory element and applying a selection voltage to the selected word line, bit line, and source line. In addition, selection of a word line, bit line, and source line coupled to a desired memory element and application of a selection voltage to the selected word line and source line enable reading of data stored in the desired memory element through the selected bit line. In write operation or erase operation, a non-selective voltage is applied to unselected word line, bit line, and source line. In also read operation, a non-selective voltage is applied to the unselected word line and source line.

Next, description will be made about write operation performed to a desired memory element using Fowler-Nordheim tunneling. In this specification, electrons are injected into the charge storage layer N of a memory element (MONOS transistor) in write operation. The state where the electrons are stored in the charge storage layer N is assumed as a state where data has been written in the memory element. In this case, since the MONOS transistor is an N-channel transistor, the threshold voltage of the memory element is high.

Figure 11A:
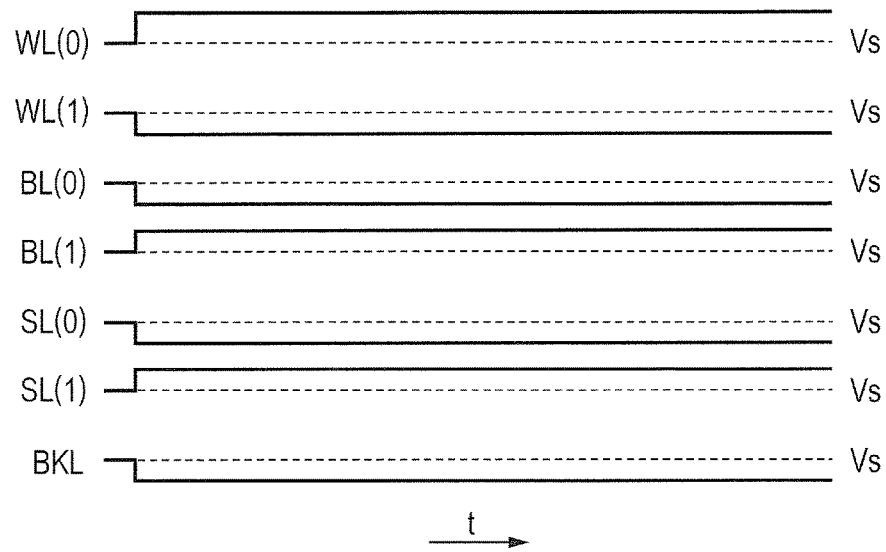
FIGS. 11A and 11B are diagrams to describe the new problem.
Figure 11B:
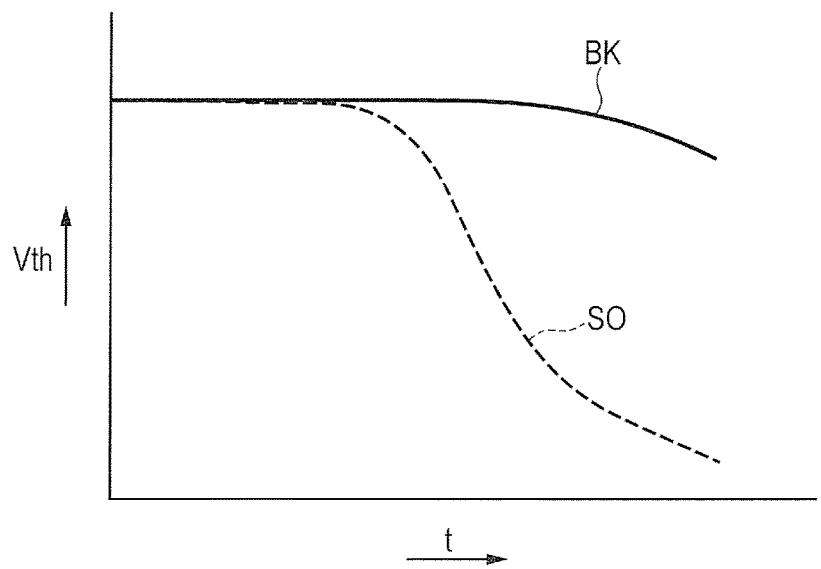

FIGS. 11A and 11B are diagrams to describe the new problem. FIG. 11A is a waveform diagram of voltages on the word lines, bit lines, source lines, and back gate line shown in FIG. 10. FIG. 11A shows waveforms when a write operation is performed on the memory element MC (00). In FIG. 11A, the horizontal axis indicates time t, while the vertical axis indicates voltage on each line. In addition, Vs, which is indicated by a dashed line in FIG. 11A, denotes a ground voltage of the circuit. The voltage over the dashed line indicates that it is positive with respect to the ground voltage Vs, while the voltage below the dashed line indicates that it is negative with respect to the ground voltage Vs.

To write the memory element MC (00), the word line WL (0), source line SL (0), and bit line BL (0) coupled to the memory element MC (00) are selected, and the remaining word line WL (1), source line SL (1), and bit line BL (1) are unselected. In the write operation using Fowler-Nordheim tunneling, as shown in FIG. 11A, a positive voltage is applied to the word line WL (0) that is selected, and a negative voltage is applied to the bit line BL (0) and source line SL (0) that are both selected. Through the voltage application, electrons are injected from the channel of the MONOS transistor MTr of the memory element MC (00) to the charge storage layer (nitride film) N. The injected electrons are stored in the charge storage layer N, thereby increasing the threshold voltage of the memory element MC (00).

To prevent the memory elements MC (01) to MC (11) from being written and being erased during the write operation to the memory element MC (00), as shown in FIG. 11A, a positive voltage is applied to the word line WL (1), bit line BL (1), and source line SL (1) that are all not unselected. Hereinafter, the word line, bit line, and source line that are selected are also referred to as a selected word line, selected bit line, and selected source line. The word line, bit line, and source line that are not selected are also referred to as an unselected word line, unselected bit line, and unselected source line.

If the memory element MC (00), which is selected to be written, is defined as a selected memory element (first memory element), the memory elements MC (01) to MC (11), except for the memory element MC (00), are defined as memory elements that are not selected (hereinafter, also referred to as unselected memory elements). The unselected memory elements can be classified into three types. Specifically, the unselected memory elements can be classified into a write-protected memory element WIS, an erroneously-writable memory element WPS, and an erroneously-erasable memory element EPS. The reference letters SLS in FIG. 10 indicate the classification type of the selected memory elements.

The write-protected memory element WIS is an unselected memory element coupled to the same word line to which the selected memory element SLS is coupled, that is, the selected word line WL (0). This write-protected memory element WIS corresponds to the memory element MC (01) in FIG. 10, and a positive voltage is applied to the word line WL (0), while a negative voltage is applied to the bit line BL (1) and source line SL (1). In other words, a positive voltage is applied to the gate electrode G of the MONOS transistor MTr of the memory element MC (01), while a negative voltage is applied to the drain region D and source region S.

The erroneously-writable memory element WPS is an unselected memory element coupled to the bit line SL (0) and source line SL (0), which are the same lines to which the selected memory element SLS is coupled. This erroneously-writable memory element WPS corresponds to the memory element MC (10) in FIG. 10, and a negative voltage is applied to the word line WL (1), while a negative voltage is applied to the bit line BL (0) and source line SL (0). In other words, a negative voltage is applied to the gate electrode G of the MONOS transistor MTr of the memory element MC (10), and a negative voltage is applied to the drain region D and source region S, too.

The erroneously-erasable memory element EPS is an unselected memory element (second memory element) coupled to an unselected word line, an unselected bit line, and an unselected source line, and also is an unselected memory element that does not share any word line, bit line, and source line with the selected memory element SLS. This erroneously-erasable memory element EPS corresponds to the memory element MC (11) in FIG. 10, and a negative voltage is applied to the word line WL (1), while a positive voltage is applied to the bit line BL (1) and source line SL (1). In other words, a negative voltage is applied to the gate electrode G of the MONOS transistor MTr of the memory element MC (11), while a positive voltage is applied to the drain region D and source region S.

Although FIG. 10 shows only the four memory elements MC (00) to MC (11), a plurality of unselected memory elements aligned in the same row as a selected memory element SLS in the matrix are classified as the write-protected memory element WIS, and a plurality of unselected memory element aligned in the same column as the selected memory element SLS in the matrix are classified as the erroneously-writable memory element WIS. In addition, a plurality of unselected memory elements arranged indifferent rows and columns from the selected memory element SLS in the matrix are classified as the erroneously-erasable memory element EPS. Viewing the matrix, the number of unselected memory elements classified as the erroneously-erasable memory element EPS is greater than the number of the unselected memory elements of the other two types.

In the case where the memory elements arranged in a matrix are composed of MONOS transistors formed over a semiconductor substrate, it is possible to prevent the unselected memory elements from being written and erased by applying an appropriate voltage to the selected word line, selected bit line, selected source line, unselected word line, unselected bit line, and unselected source line during write operation to the selected memory element.

On the contrary, in the case where the memory elements are composed of MONOS transistors formed over a semiconductor substrate with an insulating layer interposed therebetween, the inventors found through evaluations that the erroneous erase lifetime of the unselected memory element classified as the erroneously-erasable memory element EPS is shortened. FIG. 11B is a characteristic diagram of threshold voltage variations over time of a memory element classified as the erroneously-erasable memory element EPS (e.g., the memory element MC (11) in FIG. 10). The horizontal axis in FIG. 11B indicates time t, and the vertical axis indicates threshold voltage Vth of the memory element MC (11). In FIG. 11B, the solid line BK is a characteristic curve showing the threshold voltage variations of the unselected memory element MC (11) when MONOS transistors MTr making up the memory elements MC (00) to MC (11) are formed over a semiconductor substrate. The dashed line SO is a characteristic curve showing threshold voltage variations of the unselected memory element MC (11) when the memory elements MC (00) to MC (11) are formed over a semiconductor substrate with an insulating layer interposed therebetween, as described with reference to FIG. 10.

In the case of the memory elements MC (00) to MC (11) formed over a semiconductor substrate, when a write operation is performed on the selected memory element MC (00), or more specifically, when electrons are injected into the charge storage layer N of the MONOS transistor MTr of the selected memory element MC (00) to accumulate the charge in the charge storage layer N, the threshold voltage Vth of the memory element MC (11) formed over the semiconductor substrate changes a little as indicated by the characteristic curve BK, and resultantly remains high. On the contrary, in the case of the memory elements MC (00) to MC (11) formed over a semiconductor substrate with an insulating layer interposed therebetween, during a write operation to the selected memory element MC (00), the threshold voltage Vth of the unselected memory element MC (11) significantly drops as indicated by the characteristic curve SO, and resultantly changes from a high level to a low level.

Thus, the threshold voltage Vth of the unselected memory element MC (11) formed over the semiconductor substrate with the insulating layer interposed therebetween shifts from a high level to a low level while write operation is being performed on the selected memory element MC (00). The high threshold voltage Vth implies that the memory element has been written with data. This means that the unselected memory element MC (11), which is classified as the erroneously-erasable memory element EPS, has a shortened erroneous erase lifetime in which the unselected memory element MC (11) transits from a written state to an erased state. Of course, erasing the written data causes malfunction.

A cause of the threshold voltage Vth drop in the unselected memory element MC (11), as shown by the characteristic curve SO in FIG. 11B, has been discovered through the inventors' research as follows. While a write operation is performed on the selected memory element MC (00), a negative voltage is applied to the unselected word line WL (1) coupled to the unselected memory element MC (11), which is classified as the erroneously-erasable memory element EPS, and a positive voltage is applied to the unselected bit line BL (1) and unselected source line SL (1), as shown in FIG. 11A. These voltages create a potential difference between the unselected word line and the unselected bit line and unselected source line. As a result, holes are generated in the channel of the MONOS transistor MTr of the unselected memory element MC (11). At this moment, the P-type semiconductor region where the channel is formed is in an electrically floating state, and therefore the holes generated in the channel are not collected, but accumulate at the channel interface. The holes accumulating at the channel interface increase the electric field strength of the gate oxide film between the charge storage layer N and channel interface, and the high electric field probably causes discharge of the stored electrons from the nitride film making up the charge storage layer N, or injection of holes into the nitride film, thereby rapidly lowering the threshold voltage. This is probably the cause why the erroneous erase lifetime of the memory element formed over the semiconductor substrate with the insulating layer interposed therebetween is shortened in comparison with the memory element formed over the semiconductor substrate.

Configuration of Semiconductor Device

Figure 9:
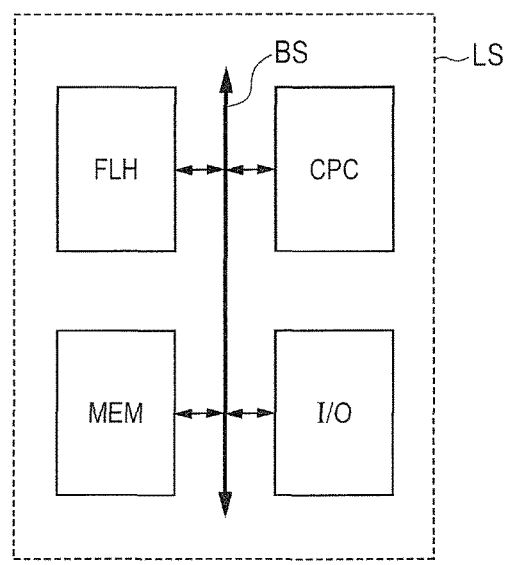
FIG. 9 is a block diagram showing the configuration of a semiconductor device according to the first embodiment.

FIG. 9 is a block diagram showing the configuration of a semiconductor device according to the first embodiment. In FIG. 9, LS denotes a semiconductor device. The semiconductor device LS includes, but is not limited to, a central processing unit CPC, a flash memory FLH, a volatile memory MEM, a peripheral circuit I/O, and a bus BS. The central processing unit CPC, flash memory FLH, volatile memory MEM, and peripheral circuit I/O are respectively composed of transistors formed with a plurality of semiconductor regions formed above a single semiconductor substrate with an insulating layer interposed therebetween, and other components. In short, a plurality of semiconductor regions (SOI layers) are formed over an insulating layer stacked over a semiconductor substrate, and the transistors formed in the SOI layers and other components make up the aforementioned circuit blocks.

The central processing unit CPC, flash memory FLH, volatile memory MEM, and peripheral circuit I/O are interconnected through the bus BS to transmit and receive data from one another through the bus BS. For example, the central processing unit CPC reads out a program stored in the flash memory FLH through the bus BS, and executes the program. In this program execution process, the central processing unit CPC accesses the volatile memory MEM, flash memory FLH, or/and peripheral circuit I/O through the bus BS to perform processing tasks required to execute the program.

Configuration of Flash Memory

FIG. 1 is a block diagram showing the configuration of the flash memory FLH according to the first embodiment. The flash memory FLH according to the first embodiment includes a memory array 1, a row selection circuit 2, a column selection circuit 3, a source line selection circuit 4, a back gate bias circuit 5, a voltage generation circuit 6, and a control circuit 7.

The memory array 1 includes memory elements MC (00) to MC (nn), word lines WL (0) to WL (n), bit lines BL (0) to BL (n), source lines SL (0) to SL (n), and back gate lines BKL. The memory elements MC (00) to MC (nn) are arranged in a matrix over an insulating layer stacked over a semiconductor substrate. The matrix (memory array 1) has rows and columns. The word lines WL (0) to WL (n) are arranged along the rows on a one-to-one basis, and the bit lines BL (0) to BL (n) and the source lines SL (0) to SL (n) are arranged along the columns, respectively, on a one-to-one basis.

In the matrix, the MONOS transistors MTr of memory elements arranged in a row have the gate electrodes G coupled to a word line arranged along the same row, and have the back gates BK coupled to a back gate line BKL arranged along the same row. In addition, the MONOS transistors MTr of memory elements arranged in a column in the matrix have the drain regions D coupled to a bit line arranged along the same column, and have the source regions S are coupled to a source line arranged along the same column.

For example, the memory elements MC (00) to MC (0n) are arranged in the 0 th row of the matrix, and the gate electrodes G of the MONOS transistors MTr of the memory elements MC (00) to MC (0n) are coupled to the word line WL (0) arranged along the 0 th row, while the back gates BK are coupled to a back gate line BKL arranged along the 0 th row. In addition, the memory elements MC (00) to MC (n0) are arranged in the 0 th column of the matrix, and the drain regions D of the MONOS transistors MTr of the memory elements MC (00) to MC (n0) are coupled to the bit line BL (0) arranged along the 0 th column, while the source regions S are coupled to the source line SL (0) arranged along the 0 th column. This arrangement is applied in the like manner to the 1st to nth rows and the 1st to n th columns.

In FIG. 1, reference letters G, S, D and BK are added to the gate electrode, source region, drain region, and back gate, respectively, of only the memory element MC (00), but the reference letters are omitted for the other memory elements, as shown in FIG. 10. An exemplary structure of the memory element will be described later with reference to FIG. 3.

The row selection circuit 2 includes a row decoder circuit 8 and a word line bias control circuit 9. The row decoder circuit 8 is coupled to the word lines WL (0) to WL (n) and the word line bias control circuit 9. The row decoder circuit 8 receives a row address signal R-Ad contained in an address signal Add, and decodes the row address signal R-Ad to identify a word line specified by the row address signal R-Ad from the word lines WL (0) to WL (n). The word line identified is a word line that is selected (selected word line), while the word line not identified is a word line that is not selected (unselected word line).

The word line bias control circuit 9 receives word line voltages VWS, VWU and a ground voltage Vs generated by the voltage generation circuit 6. The word line voltage VWS is set at a predetermined voltage value that is positive with respect to the ground voltage Vs (e.g., +5 V to +10 V), and the word line voltage VWU is set at a predetermined voltage value that is negative with respect to the ground voltage Vs (e.g., −5 V). Based on the word line voltages VWS, VWU, and the ground voltage Vs, the word line bias control circuit 9 produces a word line selective voltage to be applied to the selected word line and a word line non-selective voltage to be applied to the unselected word lines. The word line bias control circuit 9 changes the word line selective voltage and word line non-selective voltage to be produced in accordance with a word line control signal CNTW. Although it will be described later, the word line control signal CNTW is created by the control circuit 7 to notify the word line bias control circuit 9 of a write operation.

The row decoder circuit 8 applies the word line selective voltage produced by the word line bias control circuit 9 to the selected word line, and applies the word line non-selective voltage produced by the word line bias control circuit 9 to the unselected word line.

The column selection circuit 3 includes a column decoder circuit 10, a bit line bias control circuit 11, and an input/output circuit 12. The column decoder circuit 10 decodes a column address signal C-Ad contained in the address signal Add to identify a bit line specified by the column address signal C-Ad from the bit lines BL (0) to BL (n). The bit line identified is a bit line that is selected (selected bit line), while the bit line not identified is a bit line that is not selected (unselected bit line).

The bit line bias control circuit 11 receives bit line voltages VBS, VBU and a ground voltage Vs generated by the voltage generation circuit 6. The bit line voltage VBS is set at a predetermined voltage value that is negative with respect to the ground voltage Vs (e.g., −5 V), and the bit line voltage VBU is set at a predetermined voltage value that is positive with respect to the ground voltage Vs (e.g., +5 V). Based on the bit line voltages VBS, VBU, and ground voltage Vs, the bit line bias control circuit 11 produces a bit line selective voltage to be applied to the selected bit line and a bit line non-selective voltage to be applied to the unselected bit lines. When producing the bit line selective voltage and bit line non-selective voltage, the bit line bias control circuit 11 changes the bit line selective voltage and bit line non-selective voltage to be produced in accordance with a bit line control signal CNTB. The bit line control signal CNTB is also created by the control circuit 7, which will be described later, to notify the bit line bias control circuit 11 of a write operation.

The input/output circuit 12 receives a write enable signal WE. If the write enable signal WE specifies a write operation, the input/output circuit 12 acquires input data DI and supplies the input data DI to the column decoder circuit 10 the column decoder circuit 10 applies a voltage prescribed by the supplied input data DI to the selected bit line. Specifically, if the supplied input data DI gives an instruction to change the state of the selected memory element, the column decoder circuit 10 applies a bit line selective voltage produced by the bit line bias control circuit 11 to the selected bit line, and applies a bit line non-selective voltage produced by the bit line bias control circuit 11 to the unselected bit lines. When the write enable signal WE specifies a read operation, data dO on the selected bit line is conveyed to the input/output circuit 12 that in turn outputs the data dO as output data DO.

The source line selection circuit 4 includes a column decoder circuit 13 and a source line bias control circuit 14. The column decoder circuit 13 decodes a column address signal C-Ad to identify a source line specified by the column address signal C-Ad from the source lines SL (0) to SL (n). The source line identified is a source line that is selected (selected source line), while the source line not identified is a source line that is not selected (unselected source line).

The source line bias control circuit 14 receives source line voltages VSS, VSU and a ground voltage Vs generated by the voltage generation circuit 6. The source line voltage VSS is set at a predetermined voltage value that is negative with respect to the ground voltage Vs (e.g., −5 V), and the source line voltage VSU is set at a predetermined voltage value that is positive with respect to the ground voltage Vs (e.g., +5 V). Based on the source line voltages VSS, VSU, and ground voltage Vs, the source line bias control circuit 14 produces a source line selective voltage to be applied to the selected source line and a source line non-selective voltage to be applied to the unselected source lines. When producing the source line selective voltage and source line non-selective voltage, the source line bias control circuit 14 changes the source line selective voltage and source line non-selective voltage to be produced in accordance with a source line control signal CNTS. The source line control signal CNTS is also created by the control circuit 7, which will be described later, to notify the source line bias control circuit 14 of a write operation.

The source line selection circuit 4 applies a source line selective voltage produced by the source line bias control circuit 14 to the selected source line, and applies a source line non-selective voltage produced by the source line bias control circuit 14 to the unselected source lines.

Although the source line selection circuit 4 shown in FIG. 1 includes the column decoder circuit 13 as an example, this embodiment is not limited to this configuration. For example, the column decoder circuit 10 included in the column selection circuit 3 can be also used to identify the source lines.

The back gate bias circuit 5 receives a substrate bias voltage VKS and a ground voltage Vs generated by the voltage generation circuit 6, and produces a back gate voltage to be applied to the back gate lines BKL. The substrate bias voltage VKS is set at a predetermined voltage value that is negative with respect to the ground voltage Vs (e.g., −5 V). The back gate bias circuit 5 is supplied with a back gate control signal CNTK created by the control circuit 7, which will be described later. The back gate bias circuit 5 changes the back gate voltage to be produced in accordance with the supplied back gate control signal CNTK. The back gate control signal CNTK is also a control signal that notifies the back gate bias circuit 5 of a write operation.

The control circuit 7 includes a plurality of circuit blocks for creating a plurality of control signals; however, FIG. 1 shows only circuit blocks necessary for explanation. The control circuit 7 includes a write-verify control circuit 15 and a control signal forming circuit 16. A write enable signal WE is supplied to the control signal forming circuit 16. When the write enable signal WE specifies a write operation, the control signal forming circuit 16 places the aforementioned word line control signal CNTW, bit line control signal CNTB, source line control signal CNTS, and back gate control signal CNTK into, for example, a first state. Placing these control signals into the first state informs the word line bias control circuit 9, bit line bias control circuit 11, source line bias control circuit 14, and back gate bias circuit 5 that a write operation has been started.

Upon receiving an end-of-write signal WED supplied from the write-verify control circuit 15, the control signal forming circuit 16 places the aforementioned word line control signal CNTW, bit line control signal CNTB, source line control signal CNTS, and back gate control signal CNTK into a second state. Placing these control signals into the second state informs the word line bias control circuit 9, bit line bias control circuit 11, source line bias control circuit 14, and back gate bias circuit 5 that the write operation has been finished.

Write operation performed on the flash memory FLH includes injection of electrons into the charge storage layer N of a selected memory element, and verification of the threshold voltage of the selected memory element. The electron injection and threshold voltage verification are repeated until it is verified that the threshold voltage has reached a predetermined value in the threshold voltage verification. These operations appropriately control the amount of charge stored in the charge storage layer N of the selected memory element. The write-verify control circuit 15 is a circuit that controls the verification operation. Specifically, the write-verify control circuit 15 receives data dO read out through the selected bit line during a write operation, and verifies whether the threshold voltage of the selected memory element reaches a predetermined threshold voltage. When verifying that the threshold voltage has reached the predetermined threshold voltage, the write-verify control circuit 15 outputs an end-of-write signal WED.

The voltage generation circuit 6 increases or/and decreases a given voltage to produce a voltage that is positive with respect to the ground voltage Vs and a voltage that is negative with respect to the ground voltage Vs, and output the voltages, although not limited thereto. FIG. 1 clearly shows the voltages to be output, that is, the word line voltages VWS, VWU, bit line voltages VBS, VBU, source line voltages VSS, VSU, and substrate bias voltage VKS.

Operation of Flash Memory

Figure 2:
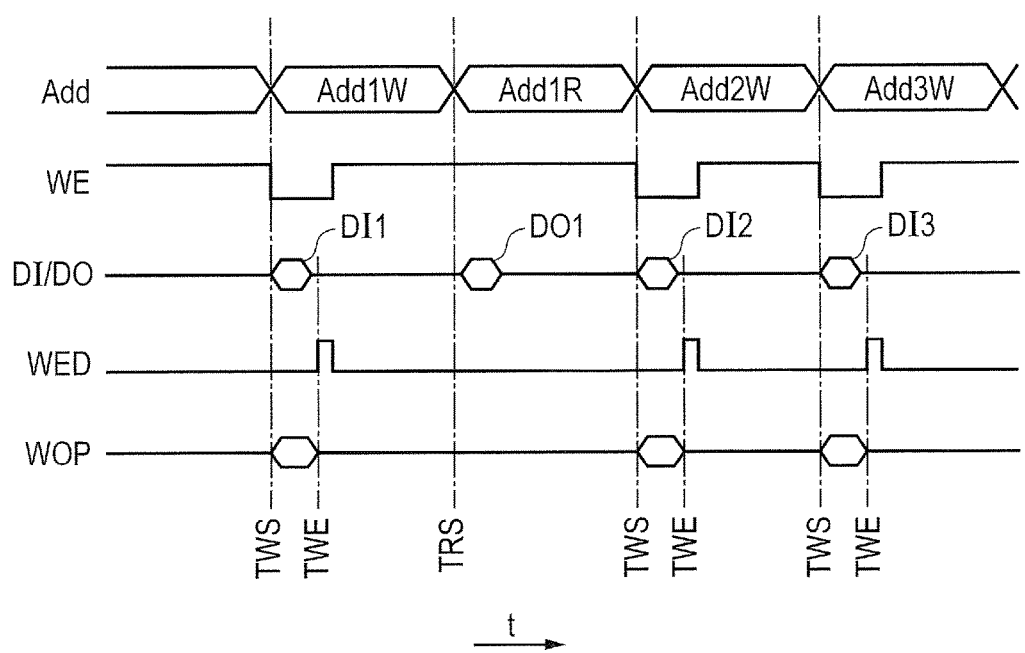
FIG. 2 is a schematic waveform diagram to describe the operation of the flash memory according to the first embodiment.

FIG. 2 is a schematic waveform diagram to describe the operation of the flash memory FLH according to the first embodiment. With reference to FIGS. 1 and 2, the operation of the flash memory FLH will be described. In FIG. 2, the horizontal axis represents time t. In addition, in FIG. 2, Add denotes an address signal containing a row address signal R-Ad and a column address signal C-Ad, WE denotes a write enable signal, DI/DO denotes input data/output data, and WED denotes an end-of-write signal. Furthermore, WOP in FIG. 2 indicates periods in which a write operation is performed in a schematic form.

Write Operation of Flash Memory

The central processing unit CPC shown in FIG. 9 creates the address signal Add, write enable signal WE, and input data DI in FIG. 2, for example, to execute processing tasks required to perform a program, and supplies the signals to the flash memory FLH. The output data DO shown in FIG. 2 is, for example, supplied to the central processing unit CPC to be used to execute the processing tasks in accordance with the program.

When the address signal Add is turned into an address signal Add1W that specifies a given memory element at a time TWS, and the write enable signal WE changes from a high level to a low level, the flash memory FLH initiates a write operation. Specifically, the flash memory FLH starts writing input data DI to a memory element specified by the address signal Add1W. The row decoder circuit 8 decodes a row address signal R-Ad contained in the address signal Add1W. The row selection circuit 2 applies a word line selective voltage to a selected word line specified by the row address signal R-Ad, and assumes the other word lines that are not specified by the row address signal R-Ad as unselected word lines and applies a word line non-selective voltage to the unselected word lines.

A column address signal C-Ad contained in the address signal Add1W is decoded by the column decoder circuits 10 and 13. Through decoding, the column selection circuit 3 and source line selection circuit 4 identify, respectively, a bit line and a source line specified by the column address signal C-Ad. The column selection circuit 3 assumes the identified bit line as a selected bit line and applies a bit line selective voltage to the selected bit line, and assumes the other bit lines that are not identified as unselected bit lines and applies a bit line non-selective voltage to the unselected bit lines. The source selection circuit 4 assumes the identified source line as a selected source line and applies a source line selective voltage to the selected source line, and assumes the other source lines that are not identified as unselected source lines and applies a source line non-selective voltage to the unselected source lines.

The back gate bias circuit 5 applies a back gate voltage to the back gate lines BKL.

The change of the write enable signal WE to a low level informs the control signal forming circuit 16 that a write operation is selected. In response to that, the control signal forming circuit 16 places the word line control signal CNTW, bit line control signal CNTB, source line control signal CNTS, and back gate control signal CNTK into the first state corresponding to write operation. Upon receipt of the signals in the first state, the word line bias control circuit 9, bit line bias control circuit 11, source line bias control circuit 14, and back gate bias circuit 5 produce a word line selective voltage and a word line non-selective voltage, a bit line selective voltage and a bit line non-selective voltage, a source line selective voltage and a source line non-selective voltage, and a back gate bias, respectively, suitable for the write operation, from the time TWS. The voltages produced are applied to the selected word line, unselected word lines, selected bit line, unselected bit lines, selected source line, unselected source lines, and back gate lines as described above.

After the selected memory element is written in accordance with the input data DI, the write-verify control circuit 15 outputs an end-of-write signal WED (a pulse at a high level in FIG. 2). This end-of-write signal WED informs the control signal forming circuit 16 that the write operation is finished. When the write operation is finished, the control signal forming circuit 16 places the word line control signal CNTW, bit line control signal CNTB, source line control signal CNTS, and back gate control signal CNTK into the second state. This completes the write operation on the selected memory element at a time TWE.

A further description about the write operation will be given later with reference to FIG. 4 and some other drawings.

Read Operation of Flash Memory

At a time TRS, the address signal Add is turned into an address signal Add1R. Since the write enable signal WE is at a high level at this moment, the flash memory FLH initiates a read operation.

Because the write enable signal WE at a high level specifies a read operation, the control signal forming circuit 16 does not place the word line control signal CNTW, bit line control signal CNTB, source line control signal CNTS, and back gate control signal CNTK into the first state corresponding to write operation.

In the same manner as the above-described write operation, a read operation requires the row decoder circuit 8 to identify a selected word line and unselected word lines based on the row address signal R-Ad, applies a word line selective voltage to the selected word line, and applies a word line non-selective voltage to the unselected word lines. Since the word line control signal CNTW is not in the first state at this moment, the word line bias control circuit 9 produces a word line selective voltage and word line non-selective voltage that are different from those for the write operation. For example, the word line selective voltage is set to a voltage on the gate electrode that turns off when the threshold voltage of the selected memory element is high and turns on when the threshold voltage of the selected memory element is low. In this example, the word line non-selective voltage is set to a ground voltage Vs.

In the same manner as the above-described write operation, the column decoder circuit 13 also identifies a selected source line and unselected source lines based on the column address signal C-Ad. The source selection circuit 4 applies a source line selective voltage to the identified selected source line, and applies a source line non-selective voltage to the identified unselected source lines. Since the source line bias control circuit 14 is not notified of the write operation by the source line control signal CNTS, the source line bias control circuit 14 produces a source line selective voltage and source line non-selective voltage that are different from those used for the write operation. For example, the source line bias control circuit 14 produces a ground voltage Vs for the source line selective voltage and source line non-selective voltage.

In the same manner as the above-described write operation, the column decoder circuit 10 also identifies a selected bit line and unselected bit lines based on the column address signal C-Ad. The column selection circuit 3 couples the identified selected bit line to the input/output circuit 12, and separates the identified unselected bit lines from the input/output circuit 12. Since the bit line bias control circuit 11 is not notified of the write operation by the bit line control signal CNTB, the bit line bias control circuit 11 produces a bit line selective voltage and bit line non-selective voltage that are different from those used for the write operation. The bit line selective voltage and bit line non-selective voltage produced by the bit line bias control circuit 11 are applied to the selected bit line and unselected bit lines, respectively, as a bias voltage. For example, the bit line selective voltage is set to a voltage value capable of making a voltage difference on the selected bit line depending on whether the selected memory element is in an on state or an off state. In this example, the bit line non-selective voltage is not particularly limited to, but is set to a ground voltage Vs.

Since the back gate bias circuit 5 is not notified of the write operation by the back gate control signal CNTK, the back gate bias circuit 5 produces a back gate voltage that is different from that used for the write operation, and applies it to the back gate line BKL. For example, the back gate bias circuit 5 continuously applies a semiconductor substrate bias voltage VKS to the back gate lines BKL during the read operation.

The threshold voltage of the memory element (MONOS transistor) is determined by the amount of electrons stored in the charge storage layer N. In read operation, the voltage change on the bit line caused by whether the selected memory element is in an on state or off state is read out as data stored in the selected memory element. For example, if the word line WL (0) and bit line BL (0) are identified as a selected word line and selected bit line based on the address signal Add1R, a word line selective voltage is applied to the word line WL (0). At this moment, a ground voltage Vs is applied to the selected source line SL (0), and therefore, the voltage on the selected bit line BL (0) changes in accordance with the threshold voltage of the selected memory element MC (00). The voltage change on the selected bit line BL (0) is output as read data DO from the input/output circuit 12.

In FIG. 2, after the address signal Add1R is supplied as an address signal Add, address signals Add2W and Add3W are supplied to select other memory elements. Since the write enable signal WE is changed to a low level, the above-described write operation is performed on the selected memory elements specified by the address signals Add2W and Add3W.

Structure of Memory Element

A description will be made about memory element structure prior to a detailed description about write operation according to the first embodiment.

Figure 3A:
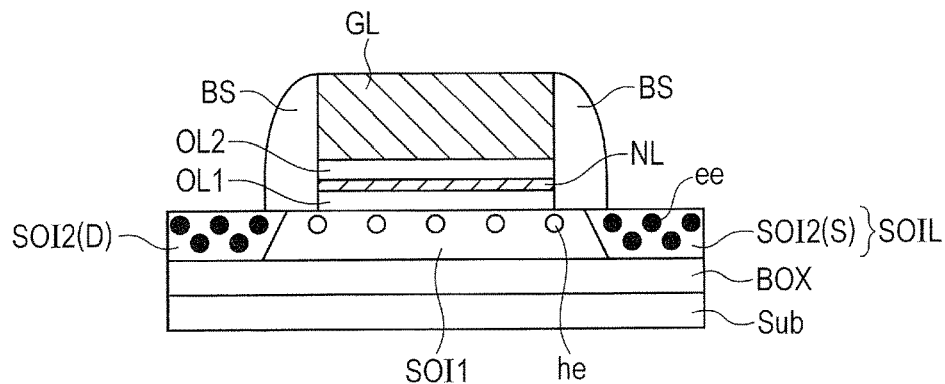
FIGS. 3A to 3C are schematic cross-sectional views showing the configuration of a memory element according to the first embodiment.
Figure 3B:
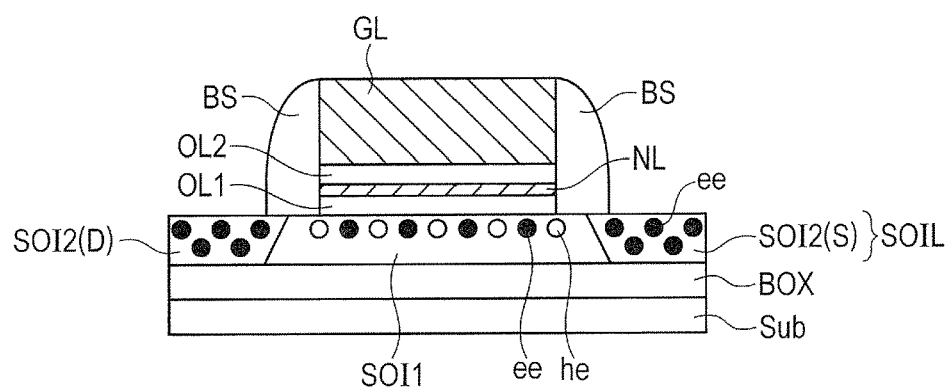
Figure 3C:
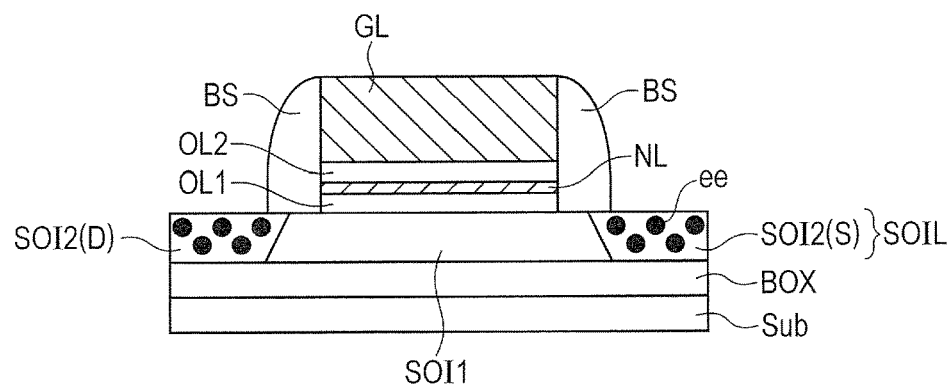

FIGS. 3A to 3C are schematic cross-sectional views showing the structure of a memory element according to the first embodiment. Open circles (○) and closed circles (●) depicted in FIGS. 3A to 3C will be referred to later to describe the operation of the erroneously-erasable memory element. This section describes only the structure of the memory element with reference to FIG. 3A, and omits the explanation about the open circles and closed circles. Note that FIGS. 3A to 3C are the same except for the open circles and closed circles.

In FIG. 3A, Sub denotes a semiconductor substrate. An insulating layer BOX is formed over a main surface of the semiconductor substrate Sub, and a semiconductor layer SOIL is formed over a main surface of the insulating layer BOX. The semiconductor layer SOII corresponds to the aforementioned SOI. In the first embodiment, the semiconductor layer SOII is a P-type semiconductor layer. An N-type impurity is introduced in predetermined regions of the P-type semiconductor layer SOII to form a pair of N-type semiconductor regions (second semiconductor regions) SOI2(D) and SOI2(S). The semiconductor region SOI2(D) serves as a drain region D of a MONOS transistor MTr, while the semiconductor region SOI2(S) serves as a source region S of the MONOS transistor MTr.

Between the N-type semiconductor regions SOI2(D) and SOI2(S) sandwiched is a semiconductor region (first semiconductor region) SOI1 in which the N-type impurity is not introduced. The semiconductor region SOI1 is a semiconductor region where a channel is formed in the MONOS transistor MTr. A gate oxide film OL1 is formed over a main surface of the semiconductor region SOI1, and a nitride film NL making up a charge storage layer N is formed over a main surface of the gate oxide film OL1. In addition, an oxide film OL2 is formed over a main surface of the nitride film NL, and a conductive layer GL serving as a gate electrode G is formed over a main surface of the oxide film OL2.

In the first embodiment, the conductive layer GL is an N-type polysilicon layer (semiconductor layer). Although it is not particularly limited, the polysilicon layer is etched to shape it into a gate electrode G, and the polysilicon layer in the shape of the gate electrode G is used as a mask while an N-type impurity is injected into the semiconductor layer SOIL Thus, the semiconductor region SOI2(D) corresponding to the drain region D of the MONOS transistor and the semiconductor region SOI2(S) corresponding to the source region S are formed through self aligning. The N-type impurity is introduced into the polysilicon layer making up the gate electrode G while the polysilicon layer is used as a mask, and therefore the gate electrode G is composed of an N-type polysilicon layer.

FIG. 3A represents the semiconductors SOI2(D), SOI2(S) as if they are located away from edges of the gate electrode GL for the purpose of making FIG. 3A clear to see; however, the actual semiconductors SOI2(D), SOI2(S) are located closer to the gate electrode GL. In FIG. 3A, BS denotes protective films.

With reference to FIG. 1, the conductive layer GL serving as a gate electrode G is coupled to a word line, the semiconductor region SOI2 (D) serving as a drain region D is coupled to a bit line, and the semiconductor region SOI2 (S) serving as a source region S is coupled to a source line. The semiconductor substrate Sub substantially plays a role of a back gate line BKL. The semiconductor region SOI1 isolated from the semiconductor substrate Sub by the insulating layer BOX is in a floating state. Since the insulating layer BOX is very thin, it is possible to control the voltage in the semiconductor region SOI1 by applying a back gate voltage to the semiconductor substrate Sub.

Although FIG. 3A shows the structure of only one of the memory elements, the other memory elements are also formed in a semiconductor layer SOI1 formed over the main surface of a single semiconductor substrate Sub with an insulating layer BOX interposed therebetween in the like manner as the memory element shown in FIG. 3A.

When viewing the MONOS transistor MTr, or the memory element, in terms of its structure, the memory element can be assumed to include a P-type semiconductor region SOI1 formed above a semiconductor substrate Sub with an insulating layer BOX interposed therebetween, a pair of N-type semiconductor regions SOI2 (D), SOI2 (S) arranged so as to sandwich the P-type semiconductor region SOI1, a nitride film NL arranged above the P-type semiconductor region SOI1 and making up a charge storage layer N, and a conductive layer GL arranged above the charge storage layer N and making up a gate electrode G.

Write Operation

FIG. 4 is a waveform diagram showing the waveforms in a write operation performed on a flash memory FLH according to the first embodiment. FIG. 4 shows voltage waveforms on word lines, bit lines, source lines, and a back gate line during a write operation. In FIG. 4, the horizontal axis represents time t, and the vertical axis of each waveform represents voltage. Similar to FIG. 11A, Vs indicated by dashed lines denotes ground voltage. In FIG. 4, the voltage above the dashed line represents a voltage value positive with respect to the ground voltage Vs, while the voltage below the dashed line represents a voltage value negative with respect to the ground voltage Vs.

As described above, the write operation on the flash memory FLH includes injection of electrons into the charge storage layer N of a selected memory element and verification of the threshold voltage of the selected memory element (write verify operation). In order to make it easier to understand the description, FIG. 4 omits waveforms associated with the write verify operation. FIG. 4 shows waveforms of the word lines, bit lines, source lines, and back gate line in a period from a time TWS at which a write operation starts, to a time TWE at which the write operation is finished, as shown in FIG. 2.

FIG. 4 shows waveforms appearing when a write operation is performed on the memory element MC (00) in FIG. 1. Specifically, the word line WL (0) is a selected word line, the word lines WL (1) to WL (n) are unselected word lines, the bit line BL (0) is a selected bit line, and the bit lines BL (1) to BL (n) are unselected bit lines. Additionally, the source line SL (0) is a selected source line, and the source lines SL (1) to SL (n) are unselected source lines. During the write operation, the waveforms of the unselected word lines WL (1) to WL (n) behave the same way, the waveforms of the unselected bit lines BL (1) to BL (n) behave the same way, and the waveforms of the unselected source lines SL (1) to SL (n) behave the same way. Because the waveforms of all the unselected lines behave the same way, FIG. 4 shows only the waveforms of the unselected word line WL (1), unselected bit line BL (1), and unselected source line SL (1) as representatives.

The voltages on the selected word line WL (0) and unselected word line WL (1) are determined by the word line selective voltage and word line non-selective voltage to be applied to the respective word lines from the row selection circuit 2, and the voltages on the selected word line WL (0) and unselected word line WL (1) can be therefore regarded as the word line selective voltage and word line non-selective voltage output from the row selection circuit 2. Similarly, the voltages on the selected bit line BL (0) and unselected bit line BL (1) can be regarded as the bit line selective voltage and bit line non-selective voltage output from the column selection circuit 3. In addition, the voltage on the selected source line SL (0) and unselected source line SL (1) can be regarded as the source line selective voltage and source line non-selective voltage output from the source line selection circuit 4. Furthermore, the voltage on the back gate line BKL can be regarded as the back gate voltage output from the back gate bias circuit 5.

In the first embodiment, when notified of a write operation by a word line control signal CNTW, the word line bias control circuit 9 (FIG. 1) produces a word line selective voltage whose value periodically changes and a word line non-selective voltage whose value periodically changes. Specifically, the word line bias control circuit 9 produces a word line selective voltage (voltage on the selected word line WL (0)) that is a positive voltage in periods T1, T3, T5, T7, T9, and changes to a ground voltage Vs in periods T2, T4, T6, T8, T10, as shown in FIG. 4. In other words, the word line selective voltage alternately changes between the positive voltage and ground voltage Vs. In this case, the word line bias control circuit 9 uses the applied word line voltage VWS as the positive voltage. The word line bias control circuit 9 produces the word line selective voltage by, for example, alternately switching between the word line voltage VWS and ground voltage Vs.

The word line bias control circuit 9 produces a word line non-selective voltage (voltage on the unselected word line WL (1)) that is a negative voltage in the periods T1, T3, T5, T7, T9, and changes to a ground voltage Vs in the periods T2, T4, T6, T8, T10 as shown in FIG. 4. In other words, the word line non-selective voltage alternately changes between the negative voltage and ground voltage Vs. In this case, the word line bias control circuit 9 uses the applied word line voltage VWU as the negative voltage. The word line bias control circuit 9 produces the word line non-selective voltage by alternately switching between the word line voltage VWU and ground voltage Vs.

In each of the periods T1, T3, T5, T7, T9, the word line selective voltage has a positive value, while the word line non-selective voltage has a negative value. In each of the periods T2, T4, T6, T8, T10, both the word line selective voltage and word line non-selective voltage are the ground voltage Vs.

When notified of the write operation by a bit line control signal CNTB, the bit line bias control circuit 11 (FIG. 1) produces a bit line selective voltage whose value periodically changes and a bit line non-selective voltage whose value periodically changes as the word line bias control circuit 9 does. Specifically, the bit line bias control circuit 11 produces a bit line selective voltage (voltage on the selected bit line BL(0)) that is a negative voltage in the periods T1, T3, T5, T7, T9, and changes to a ground voltage Vs in the periods T2, T4, T6, T8, T10, as shown in FIG. 4. In other words, the bit line selective voltage alternately changes between the negative voltage and ground voltage Vs. In this case, the bit line bias control circuit 11 uses the applied bit line voltage VBS as the negative voltage. The bit line bias control circuit 11 produces the bit line selective voltage by, for example, alternately switching between the bit line voltage VBS and ground voltage Vs.

In addition, the bit line bias control circuit 11 produces a bit line non-selective voltage (voltage on the unselected bit line BL (1)) that is a positive voltage in the periods T1, T3, T5, T7, T9, and changes to the ground voltage Vs in the periods T2, T4, T6, T8, T10 as shown in FIG. 4. In other words, the bit line non-selective voltage alternately changes between the positive voltage and ground voltage Vs. In this case, the bit line bias control circuit 11 uses the applied bit line voltage VBU as the positive voltage. The bit line bias control circuit 11 produces the bit line non-selective voltage by alternately switching between the bit line voltage VBU and ground voltage Vs.

In each of the periods T1, T3, T5, T7, T9, the bit line selective voltage has a negative value, while the bit line non-selective voltage has a positive value. In each of the periods T2, T4, T6, T8, T10, both the bit line selective voltage and bit line non-selective voltage are the ground voltage Vs.

When notified of the write operation by a source line control signal CNTS, the source line bias control circuit 14 (FIG. 1) produces a source line selective voltage whose value periodically changes and a source line non-selective voltage whose value periodically changes as the bit line bias control circuit 11 does. Specifically, the source line bias control circuit 14 produces a source line selective voltage (voltage on the selected source line SL (0)) that is a negative voltage in the periods T1, T3, T5, T7, T9, and changes to a ground voltage Vs in the periods T2, T4, T6, T8, T10, as shown in FIG. 4. In other words, the source line selective voltage alternately changes between the negative voltage and ground voltage Vs. In this case, the source line bias control circuit 14 uses the applied source line voltage VSS as the negative voltage. The source line bias control circuit 14 produces the source line selective voltage by, for example, alternately switching between the source line voltage VSS and ground voltage Vs.

In addition, the source line bias control circuit 14 produces a source line non-selective voltage (voltage on the unselected source line SL (1)) that is a positive voltage in the periods T1, T3, T5, T7, T9, and changes to the ground voltage Vs in the periods T2, T4, T6, T8, T10, as shown in FIG. 4. In other words, the source line non-selective voltage alternately changes between the positive voltage and ground voltage Vs. In this case, the source line bias control circuit 14 uses the applied source line voltage VSU as the positive voltage. The source line bias control circuit 14 produces the source line non-selective voltage by, for example, alternately switching between the source line voltage VSU and ground voltage Vs.

In each of the periods T1, T3, T5, T7, T9, the source line selective voltage has a negative value, while the source line non-selective voltage has a positive value. In each of the periods T2, T4, T6, T8, T10, both the source line selective voltage and source line non-selective voltage are the ground voltage Vs.

When notified of the write operation by a back gate control signal CNTK, the back gate bias circuit 5 periodically changes the back gate voltage (voltage on the back gate line BKL) as shown in FIG. 4. Specifically, the back gate bias circuit 5 produces a back gate voltage that is a negative voltage in the periods T1, T3, T5, T7, T9, and changes to the ground voltage Vs in the periods T2, T4, T6, T8, T10. For example, the back gate bias circuit 5 produces the back gate voltage by alternately switching between the applied substrate bias voltage VKS and ground voltage Vs.

In the first embodiment, the voltages on the selected bit line BL (0), selected source line SL (0), unselected word line WL (1), unselected bit line BL (1), unselected source line SL (1), and back gate line BKL behave all the same way as those in FIG. 11 in the periods T1, T3, T5, T7, T9 when the voltage on the selected word line WL (0) is a positive voltage, more specifically, when the word line selective voltage is a positive voltage. This implies that electrons are injected into the charge storage layer N of the selected memory element MC (00) in each of the periods T1, T3, T5, T7, T9, to write the selected memory element MC (00). In these periods, as described above, holes accumulate in the channel of the MONOS transistor MTr of the unselected memory elements MC (11) to MC (nn) that are classified as erroneously-erasable memory elements EPS (FIG. 10) among the unselected memory elements.

FIGS. 5A and 5B are characteristic diagrams showing the variations of the electric field and charge of an unselected memory element according to the first embodiment. Specifically, FIG. 5A shows the variations of the electric field of a gate oxide film of an unselected memory element, which is classified as the erroneously-erasable memory element EPS, and FIG. 5B shows the variations of charge in the channel. This section describes the memory element MC (11) as an example of the unselected memory element classified as the erroneously-erasable memory element EPS; however, the other unselected memory elements classified as the erroneously-erasable memory elements EPS have the same characteristics.

In FIGS. 5A and 5B, the horizontal axis represents time. Periods T1 to T10 shown in FIGS. 5A and 5B are equivalent to the periods T1 to T10 shown in FIG. 4. For example, the periods T1 and T2 in FIGS. 5A and 5B correspond to the periods T1 and T2 in FIG. 4, respectively. Accordingly, in each of the periods T1, T3, T5, T7, T9 shown in FIGS. 5A and 5B, electrons, which serves as charge, are injected into the charge storage layer N of the selected memory element MC (00), and are stored in the layer.

In FIG. 5A, the vertical axis indicates the electric field of the gate oxide film of the MONOS transistor MTr of the unselected memory element MC (11). FIG. 5A shows a curve Bch indicated by a dashed line. The curve Bch is a characteristic curve representing the variations in electric field when, as shown in FIG. 11A, a negative word line non-selective voltage is continuously applied to the unselected word line WL (1), and a positive bit line non-selective voltage and a positive source line non-selective voltage are continuously applied to the unselected bit line BL (1) and unselected source line SL (1), respectively. At this moment, a negative voltage is continuously applied to the back gate line BKL, too.

FIG. 5A also shows a curve Sch indicated by a solid line. The curve Sch is a characteristic curve representing the variations in electric field when, as shown in FIG. 4, the word line non-selective voltage applied to the unselected word line WL (1) is periodically changed, and the bit line non-selective voltage and source line non-selective voltage applied to the unselected bit line BL (1) and unselected source line SL (1) are also periodically changed. At this moment, the back gate voltage applied to the back gate line BKL is periodically changed, too.

The vertical axis in FIG. 5B represents the charge density (carrier density) in the channel of the MONOS transistor MTr of the unselected memory element MC (11). In FIG. 5B, the curve Sche is a characteristic curve representing the variations in hole density out of the charge density in the channel. In FIG. 5B, the curve Scee is a characteristic curve representing the variations in electron density out of the charge density in the channel.

As shown by the characteristic curve Sche in FIG. 5B, holes are injected into the channel of the unselected memory element MC (11) in each of the periods T1, T3, T5, T7, T9 in which electrons are injected into the charge storage layer N of the selected memory element MC (00), and the holes start accumulating gradually at the channel interface. On the contrary, as shown by the characteristic curve Scee in FIG. 5B, electrons are injected into the channel of the unselected memory element MC (11) in each of the periods T2, T4, T6, T8, T10 in which electrons are not injected into the charge storage layer N of the selected memory element MC (00).

In the periods T2, T4, T6, T8, T10, the word line non-selective voltage applied to the unselected word line WL (1), the bit line non-selective voltage applied to the unselected bit line BL (1), the source line non-selective voltage applied to the unselected source line SL (1), and the back gate voltage applied to the back gate line BKL are all set to the same ground voltage Vs. As described with reference to FIG. 3, in the first embodiment, an N-type polysilicon layer is used as a conductive layer GL that makes up a gate electrode G, and a P-type semiconductor region is used as a semiconductor region SOI1 where the channel is formed. This configuration creates a difference in work function between the conductive layer GL making up the gate electrode G and the semiconductor region SOI1. The work function difference substantially creates a potential difference between the gate electrode G and channel even if the same ground voltages Vs are applied to the gate electrode G (unselected word line) and the drain region D (unselected bit line) and source region S (unselected source line), and resultantly electrons are injected into the channel from the drain region D and source region S.

The holes injected into the channel in the periods T1, T3, T5, T7, T9 recombine with the injected electrons in the subsequent periods T2, T4, T6, T8, T10, and therefore the holes accumulated in the channel decrease, and the electric field is thereby lowered as shown by the characteristic curve Sch in FIG. 5A. This can prevent the unselected memory element MC (11), which is classified as the erroneously-erasable memory element EPS, from changing its threshold voltage. Thus, the possibility of erroneously erasing the unselected memory element, which is classified as the erroneously-erasable memory element EPS, can be reduced.

The following describes the operation in the unselected memory element MC (11) in a diagrammatic way with reference to FIGS. 3A to 3C. In FIGS. 3A to 3C, open circles (∘) diagrammatically represent holes, part of which is indicated by a reference letter he. In FIGS. 3A to 3C, closed circles (●) diagrammatically represent electrons, part of which is indicated by a reference letter ee. FIG. 3A shows the unselected memory element MC (11) in a period T1, and FIGS. 3B and 3C show the unselected memory element MC (11) in a period T2 following the period T1.

In FIG. 3A, a negative word line non-selective voltage is applied to the gate electrode G through the unselected word line WL (1), and a positive bit line non-selective voltage and a positive source line non-selective voltage are applied to the drain region D and source region S through the unselected bit line BL (1) and unselected source line SL (1), respectively. At this moment, a negative back gate voltage is applied to the semiconductor substrate Sub. Through the voltage application, holes he are injected into the channel of the MONOS transistor MTr, and accumulate at the channel interface.

When the period T2 arrives, the word line non-selective voltage applied to the gate electrode G changes from the negative voltage to the ground voltage Vs, and the bit line non-selective voltage and source line non-selective voltage applied to the drain region D and source region S change from the positive voltage to the ground voltage Vs. Through the voltage application, electrons ee are injected into the channel of the MONOS transistor MTr from the drain region D and source region S. The injected electrons ee recombine with the holes he. As a result, as shown in FIG. 3C, the holes he accumulated at the interface of the MONOS transistor MTr disappear or decrease before the transition from the periods T2 to the period T3.

As shown in FIG. 5B, the hole density in the channel of the MONOS transistor MTr becomes high in the periods T1, T3, T5, T7, T9 as indicated by the characteristic curve Sche, but the electron density in the channel becomes high in the following periods T2, T4, T6, T8, T10 as indicated by the characteristic curve Scee, and recombination of the holes and electrons occurs in the periods T2, T4, T6, T8, T10, and the holes thereby decrease.

As shown in FIG. 11A, if there is a potential difference between the word line non-selective voltage and the bit line non-selective voltage and source line non-selective voltage, holes are stored in the channel. The holes stored at the channel interface of the unselected memory element MC (11) with electrons stored in the charge storage layer N make the electric field of, for example, the insulating film (e.g., OL1 in FIG. 3) stronger as indicated by the characteristic curve Bch in FIG. 5A. The strong electric field causes ejection of the electrons stored in the charge storage layer N or injection of the holes into the charge storage layer N. On the contrary, in the first embodiment, the holes injected and stored in the channel in the periods T1, T3, T5, T7, T9 can be reduced by injecting electrons into the channel in the periods T2, T4, T6, T8, T10. Consequently, for example, the electric field of the insulating film can be prevented from being strong, and therefore the amount of the electrons in the charge storage layer N to be ejected or the amount of holes to be injected to the charge storage layer N can be reduced. Thus, the erroneous erase lifetime until which the unselected memory element, which is classified as the erroneously-erasable memory element EPS, in a write state changes its state can be prevented from being shortened.

Second Embodiment

Figure 6:
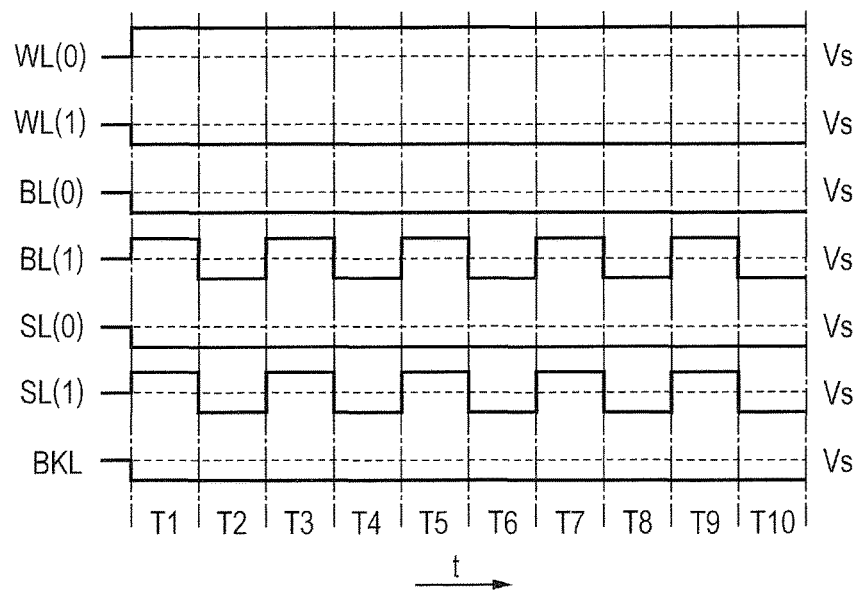
FIG. 6 is a waveform diagram showing waveforms during a write operation performed on a flash memory according to the second embodiment.

FIG. 6 is a waveform diagram showing waveforms in a write operation performed on a flash memory FLH according to the second embodiment. In the waveform diagram in FIG. 6, the memory element MC (00) in FIG. 1 is a selected memory element, and the memory element MC (11) is an unselected memory element classified as the erroneously-erasable memory element as described in the first embodiment.

As described with reference to FIG. 4, the voltage on the selected word line WL (0) is regarded as a word line selective voltage, and the voltage on the unselected word line WL (1) is regarded as a word line non-selective voltage. In addition, the voltage on the selected bit line BL (0) is regarded as a bit line selective voltage, and the voltage on the unselected bit line BL (1) is regarded as a bit line non-selective voltage. Furthermore, the voltage on the selected source line SL (0) is regarded as a source line selective voltage, and the voltage on the unselected source line SL (1) is regarded as a source line non-selective voltage. In order to make it easier to understand the description, FIG. 6 also omits waveforms associated with a write verify operation.

First, differences between the voltage waveforms in FIG. 6 and the voltage waveforms in FIG. 11A will be described. One of the differences from FIG. 11A is that the bit line non-selective voltage and source line non-selective voltage applied to the unselected bit line BL (1) and unselected source line SL (1), respectively, periodically change. Specifically, the bit line non-selective voltage and source line non-selective voltage independently alternates periodically between positive and negative with respect to the ground voltage Vs. The bit line non-selective voltage and source line non-selective voltage are positive in the periods T1, T3, T5, T7, T9 as with the case of FIG. 11A. On the other hand, the bit line non-selective voltage and source line non-selective voltage are negative in the periods T2, T4, T6, T8, T10 as the word line non-selective voltage is.

Thus, the voltages on the unselected bit line BL (1) and unselected source line SL 1) are positive in the periods T1, T3, T5, T7, T9 as with the case of FIG. 11A. On the other hand, the voltages on the unselected bit line BL (1) and unselected source line SL (1) are negative in the periods T2, T4, T6, T8, T10 as the voltage on the unselected word line WL (1) is.

The voltage on the unselected word line WL (1) is kept negative through the periods T1 to T10, while the voltages on the unselected bit line BL (1) and unselected source line SL (1) are positive in the periods T1, T3, T5, T7, T9. Therefore, as described with reference to FIG. 11A, holes are injected into the channel of the MONOS transistor MTr of the unselected memory element MC (11) classified as the erroneously-erasable memory element EPS in the periods T1, T3, T5, T7, T9. On the other hand, the voltages on the unselected bit line BL (1) and unselected source line SL (1) are negative in the periods T2, T4, T6, T8, T10 as the voltage on the unselected word line is. Because these voltages are negative, the potential difference between the unselected word line WL (1) and the unselected bit line BL (1) and unselected source line SL (1) becomes small in the periods T2, T4, T6, T8, T10. For example, the voltages on the unselected word line WL (1), unselected bit line BL (1), and unselected source line SL (1) become all the same. In these periods where the potential difference is small, electrons are injected into the channel of the MONOS transistor MTr of the unselected memory element MC (11) as described in the first embodiment. Consequently, as with the case of the first embodiment, the erroneous erase lifetime can be prevented from being shortened. In addition, in the second embodiment, a positive voltage is continuously applied as a word line selective voltage to the selected word line WL (0) coupled to the selected memory element MC (00) through all the periods T1 to T10, while a negative bit line selective voltage and a negative source line selective voltage are continuously applied to the selected bit line BL (0) and selected source line SL (0), respectively, through all the periods, thereby shortening the time required to write the selected memory element.

Third Embodiment

Figure 7:
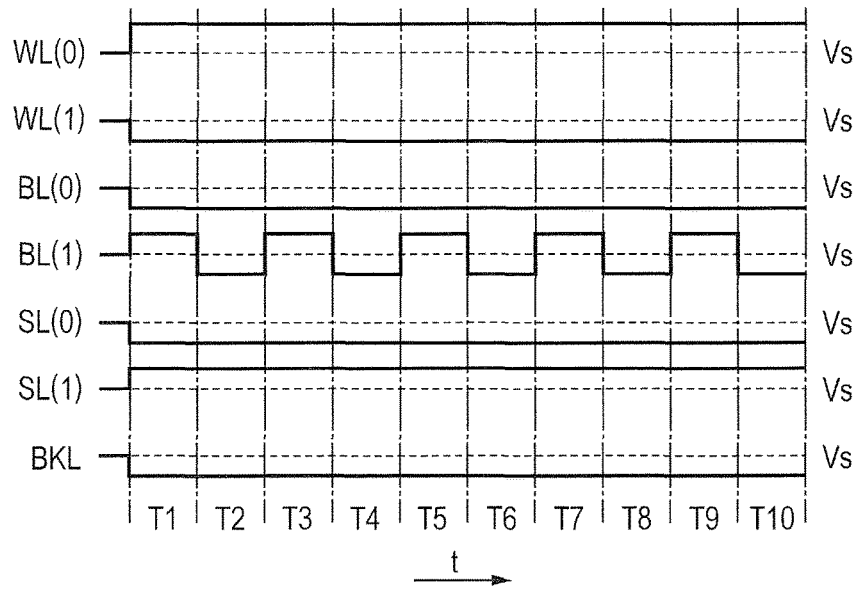
FIG. 7 is a waveform diagram showing waveforms during a write operation performed on a flash memory according to the third embodiment.

FIG. 7 is a waveform diagram showing waveforms in a write operation performed on a flash memory FLH according to the third embodiment. In the waveform diagram in FIG. 7, the memory element MC (00) shown in FIG. 1 is a selected memory element, and the memory element MC (11) is an unselected memory element classified as the erroneously-erasable memory element EPS, as described in the first and second embodiments.

As described with reference to FIGS. 4 and 6, the voltage on the selected word line WL (0) is regarded as a word line selective voltage, and the voltage on the unselected word line WL (1) is regarded as a word line non-selective voltage. In addition, the voltage on the selected bit line BL (0) is regarded as a bit line selective voltage, and the voltage on the unselected bit line BL (1) is regarded as a bit line non-selective voltage. Furthermore, the voltage on the selected source line SL (0) is regarded as a source line selective voltage, and the voltage on the unselected source line SL (1) is regarded as a source line non-selective voltage. In order to make it easier to understand the description, FIG. 7 also omits waveforms associated with a write verify operation.

First, differences between the voltage waveforms in FIG. 7 and the voltage waveforms in FIG. 11A will be described. One of the differences from FIG. 11A is that the bit line non-selective voltage applied to the unselected bit line BL (1) periodically changes. Specifically, the bit line non-selective voltage periodically alternates between positive and negative with respect to the ground voltage Vs. The bit line non-selective voltage is positive in the periods T1, T3, T5, T7, T9 as with the case of FIG. 11A. On the other hand, the bit line non-selective voltage is negative in the periods T2, T4, T6, T8, T10 as the word line non-selective voltage is.

Thus, the voltages on the unselected bit line BL (1) and unselected source line SL (1) are positive in the periods T1, T3, T5, T7, T9 as with the case of FIG. 11A. On the other hand, the voltage on the unselected bit line BL (1) is negative in the periods T2, T4, T6, T8, T10 as the voltage on the unselected word line WL (1) is.

The voltage on the unselected word line WL (1) is negative in the periods T1, T3, T5, T7, T9, while the voltages on the unselected bit line BL (1) and unselected source line SL (1) are positive in the periods T1, T3, T5, T7, T9. Therefore, as described with reference to FIG. 11A, holes are injected into the channel of the MONOS transistor MTr of the unselected memory element MC (11) classified as the erroneously-erasable memory element EPS. On the other hand, the voltage on the unselected bit line BL (1) is negative in the periods T2, T4, T6, T8, T10 as the voltage on the unselected word line WL (1) is. Because the voltage is negative, the potential difference between the unselected word line WL (1) and the unselected bit line BL (1) becomes small in the periods T2, T4, T6, T8, T10. For example, the voltages on the unselected word line WL (1) and the unselected bit line BL (1) become the same. In these periods where the potential difference is small, electrons are injected into the channel of the MONOS transistor MTr of the unselected memory element MC (11) from the drain region D coupled to the unselected bit line, as described in the first embodiment. Consequently, as with the case of the first embodiment, the erroneous erase lifetime can be prevented from being shortened.

In addition, in the third embodiment, a positive voltage is continuously applied as a word line selective voltage to the selected word line WL (0) coupled to the selected memory element MC (00) through all the periods T1 to T10, and a negative bit line selective voltage and a negative source line selective voltage are continuously applied to the selected bit line BL (0) and selected source line SL (0), respectively, through all the periods, thereby shortening the time required to write the selected memory element.

In the first and second embodiments, a negative voltage is applied to both the unselected bit line BL (1) and unselected source line SL (1) in the periods T2, T4, T6, T8, T10. On the other hand, in the third embodiment, a negative voltage is applied as a bit line non-selective voltage to the unselected bit line BL (1), and a positive voltage is applied as a source line non-selective voltage to the unselected source line BL (1), in the periods T2, T4, T6, T8, T10. When focusing on the unselected memory element MC (11) classified as the erroneously-erasable memory element EPS, a negative voltage is applied to the drain region D of the MONOS transistor MTr making up the unselected memory element MC (11), and a positive voltage is applied to the source region S, for example, in the period T2. This creates a potential difference between the drain region D and source region S. The potential difference causes a drift field that allows electrons to be supplied from the drain region D to the channel interface in a shorter period of time. This phenomenon occurs in the periods T4, T6, T8, and T10 in addition to the period T2 described as an example.

Modification

FIG. 7 shows an example in which the bit line non-selective voltage applied to the unselected bit line BL (1) is periodically changed; however, in this modification, the source line non-selective voltage applied to the unselected source line SL (1) periodically changes. Specifically, the source line non-selective voltage periodically alternates between positive and negative with respect to the ground voltage Vs during a write operation. In this modification, the source line non-selective voltage is positive in the periods T1, T3, T5, T7, T9, while the source line non-selective voltage is negative in the periods T2, T4, T6, T8, T10. The bit line non-selective voltage applied to the unselected bit line BL (1) is continuously kept positive through the periods T1 to T10.

Through the voltage application, a positive non-selective voltage is applied to the unselected bit line BL (1) during the write operation, and therefore the voltage on the unselected bit line BL (1) is positive. On the other hand, a positive source line non-selective voltage is applied to the unselected source line SL (1) in the periods T1, T3, T5, T7, T9, and therefore the voltage on the unselected source line SL (1) is positive. In addition, a negative source line non-selective voltage is applied to the unselected source line SL (1) in the periods T2, T4, T6, T8, T10, and therefore the voltage on the unselected source line SL (1) is negative. Consequently, the potential difference between the unselected word line WL (1) and unselected source line SL (1) becomes small in the periods T2, T4, T6, T8, T10, and electrons are injected into the channel of the unselected memory element MC (11) as described in the first embodiment. In this case, the electrons are injected from the source region S coupled to the unselected source line SL (1) into the channel. Thus, the erroneous erase lifetime of the unselected memory element, which is classified as the erroneously-erasable memory element EPS, can be prevented from being shortened.

Also in this modification, a negative word line selective voltage, positive bit line selective voltage, and positive source line selective voltage are continuously applied to the selected memory element MC (00) during the write operation in the same manner as shown in FIG. 11A, thereby shortening the time required to write the selected memory element.

Furthermore, a negative voltage is applied to the source region S of the unselected memory element classified as the erroneously-erasable memory element EPS and a positive voltage is applied to the drain region D in the periods T2, T4, T6, T8, T10. The voltage application creates a potential difference between the source region S and drain region D. The potential difference causes a drift field that allows electrons to be supplied from the source region S to the channel interface in a shorter period of time.

Fourth Embodiment

Figure 8:
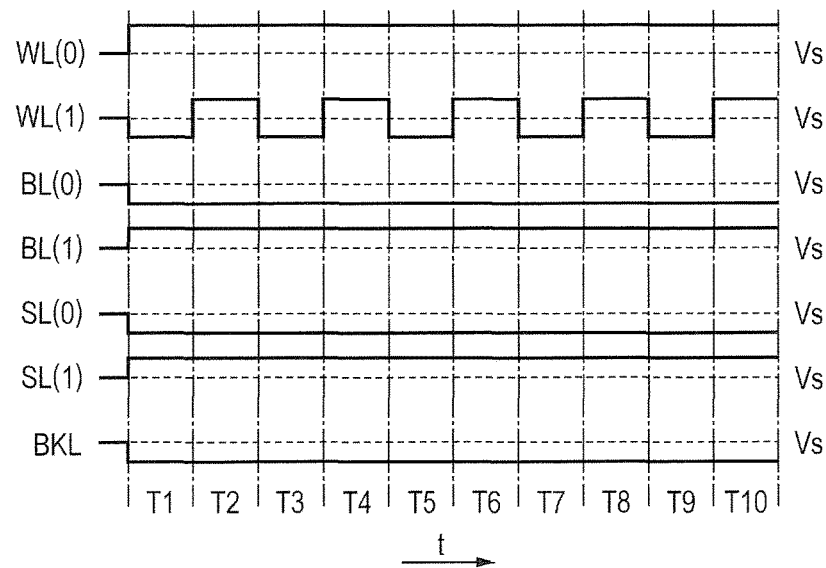
FIG. 8 is a waveform diagram showing waveforms during a write operation performed on a flash memory according to the fourth embodiment.

FIG. 8 is a waveform diagram showing waveforms in a write operation performed on a flash memory FLH according to the fourth embodiment. FIG. 8 shows voltage waveforms of the selected word line WL (0), unselected word line WL (1), selected bit line BL(0), unselected bit line BL (1), selected source line SL (0), unselected source line SL (1), and back gate line BKL as shown in FIG. 4. A word line selective voltage and word line non-selective voltage produced by the word line bias control circuit 9 shown in FIG. 1 are applied to the selected word line WL (0) and unselected word line WL (1), respectively. A bit line selective voltage and bit line non-selective voltage produced by the bit line bias control circuit 11 shown in FIG. 1 are applied to the selected bit line BL (0) and unselected bit line BL (1), respectively. A source line selective voltage and source line non-selective voltage produced by the source line bias control circuit 14 shown in FIG. 1 are applied to the selected source line SL (0) and unselected source line SL (1), respectively. In addition, a back gate voltage produced by a back gate bias circuit 5 shown in FIG. 1 is applied to the back gate line BKL.

Accordingly, it can be assumed that FIG. 8 shows waveforms of a word line selective voltage, word line non-selective voltage, bit line selective voltage, bit line non-selective voltage, source line selective voltage, source line non-selective voltage, and back gate voltage, as shown in FIG. 4. In order to make it easier to understand the description, FIG. 8 also omits waveforms associated with a write verify operation.

Differences between the waveforms in FIG. 4 and the waveforms according to the fourth embodiment (FIG. 8) will be described. In the first embodiment, the word line selective voltage, word line non-selective voltage, bit line selective voltage, bit line non-selective voltage, source line selective voltage, source line non-selective voltage, and back gate voltage periodically change in a period in which a write operation is performed (period from time TWS to TWE in FIG. 2). On the other hand, in the fourth embodiment, only the word line non-selective voltage periodically alternates between positive and negative. In addition, in the fourth embodiment, the word line selective voltage is kept positive, and the bit line selective voltage, source line selective voltage, and back gate voltage are kept negative during the write operation. Also, the bit line non-selective voltage and source line non-selective voltage are kept positive in the write operation. In short, except for the word line non-selective voltage, the word line selective voltage, bit line selective voltage, bit line non-selective voltage, source line selective voltage, source line non-selective voltage, and back gate voltage exhibit the similar waveforms as those shown in FIG. 11A.

As described above, in the fourth embodiment, electrons are injected into the charge storage layer N of the selected memory element MC (00) through all the periods T1 to T10 as described with reference to FIG. 11A.

On the other hand, the word line non-selective voltage applied to the unselected word line WL (1) changes to negative with respect to the ground voltage Vs in the periods T1, T3, T5, T7, T9, while changing to positive with respect to the ground voltage Vs in the periods T2, T4, T6, T8, T10. In short, the word line non-selective voltage periodically alternates between negative and positive. Accordingly, the voltage on the unselected word line WL (1) periodically changes during the write operation as shown in FIG. 8. On the other hand, the voltages on the selected word line WL (0), unselected bit line BL (1), and unselected source line SL (1) are kept positive as shown in FIG. 8. In addition, the voltages on the selected bit line BL (0), selected source line SL (0), and back gate line BKL are kept negative as shown in FIG. 8.

Since the word line non-selective voltage changes to negative in the periods T1, T3, T5, T7, T9, the voltages on the unselected word line WL (1), unselected bit line BL (1), unselected source line SL (1), and back gate line BKL become the same as the voltages shown in FIG. 11A. Accordingly, holes are injected into the channel of the MONOS transistor MTr making up the memory element MC (11) in the periods T1, T3, T5, T7, T9.

On the other hand, the word line non-selective voltage changes to positive in the periods T2, T4, T6, T8, T10, and therefore the potential difference between the voltages on the unselected bit line BL (1) and unselected source line SL (1) and the voltage on the unselected word line WL (1) becomes small. For example, the voltages on the unselected word line WL (1), unselected bit line BL (1), and unselected source line SL (1) become all the same. Accordingly, as described in the first embodiment, electrons are injected into the channel of the MONOS transistor MTr of the unselected memory element MC (11) classified as the erroneously-erasable memory element EPS, and the electrons recombine with the holes accumulated in the channel of the unselected memory element MC (11), thereby preventing the erroneous erase lifetime from being shortened.

In the fourth embodiment, electrons are injected into the charge storage layer N of the MONOS transistor MTr of the selected memory element MC (00) through all the periods T1 to T10. This can shorten the time required to write the selected memory element.

In the second embodiment, for example, a negative bit line non-selective voltage and a negative source line non-selective voltage are applied to the unselected bit line BL (1) and unselected source line SL (1), respectively, in the periods T2, T4, T6, T8, T10. In the same periods T2, T4, T6, T8, T10, a positive word line selective voltage is applied to the selected word line WL (0) in the second embodiment. The positive word line selective voltage may bring the unselected memory element coupled to the selected word line, unselected bit line, and unselected source line, or more specifically, the unselected memory element (e.g., MC (01)) classified as the write-protected memory element WIS described with reference to FIG. 10, into the same state as the selected memory element in the periods T2, T4, T6, T8, T10, and the unselected memory element may be weakly written and possibly lose the stored data.

However, in the fourth embodiment, a positive bit line non-selective voltage and a positive source line non-selective voltage are applied to the unselected bit line BL (1) and unselected source line SL (1), respectively, in each of the periods T2, T4, T6, T8, T10, thereby being able to prevent the unselected memory element classified as the write-protected memory element WIS from being weakly written in the periods T2, T4, T6, T8, T10.

Although the first to fourth embodiments have been described using the word lines WL (0), WL (1), bit lines BL (0), BL (1), and source lines SL (0), SL (1) as examples, the other word lines, bit lines, and source lines will be treated in the same way.

Although the write operation is designed to be achieved at a high threshold voltage in the first to fourth embodiments, the write operation can be achieved at a low threshold voltage. In this case, injection and accumulation of electrons in the charge storage layer of the MONOS transistor will be implemented in erase operation. If a memory element is selected from memory elements arranged in a matrix in erase operation, some unselected memory elements are classified as erroneously-erasable memory elements EPS in the same manner as the write operation described in the first to fourth embodiments. Even if the write operation is designed to be achieved at a low threshold voltage, the unselected memory elements classified as the erroneously-erasable memory elements EPS can be prevented from changing their states in the erase operation.

The erase operation also includes an erase verify operation to verify whether the threshold voltage of a selected memory element has reached a predetermined value. In the erase verify operation, the time at which the threshold voltage of the selected memory element is verified to have reached the predetermined value can be used as the time at which the aforementioned end-of-write signal WED is output.

Although the first to fourth embodiments have been described using the N-channel MONOS transistor as an example, these embodiments can be implemented using a P-channel MONOS transistor. When using the P-channel MONOS transistor, the semiconductor region SOI1 where a channel is formed in FIG. 3 is an N-type semiconductor region, and the drain region SOI2 (D) and source region SOI2 (S) are P-type semiconductor regions. In addition, the gate electrode G is made of, for example, a P-type polysilicon layer.

When a write operation is performed on a MONOS transistor, the threshold voltage is changed by injecting majority charge carriers of the drain region D and source region S into the charge storage layer N and storing the majority charge carriers in the charge storage layer N. As described in the first to fourth embodiments, since the drain region D and source region S of the N-channel MONOS transistor are N-type (first conductivity type) semiconductor regions, the majority charge carriers of the drain region D and source region S are electrons, and therefore electrons are stored in the charge storage layer N. On the other hand, since the drain region D and source region S of the P-channel MONOS transistor are P-type (second conductivity type) semiconductor regions, the majority charge carriers of the drain region D and source region S are holes.

In the first to fourth embodiments, when a write operation is performed on a MONOS transistor MTr making up a selected memory element (e.g., MC (00)), holes are injected into the channel of the MONOS transistor MTr making up an unselected memory element (e.g., MC (11)) classified as an erroneously-erasable memory element EPS as shown in FIG. 3A. The holes are the majority charge carriers of the P-type (second conductivity type) semiconductor region whose conductivity type is different from that of the N-type (first conductivity type) semiconductor regions forming the drain region D and source region S.

During the write operation performed on the selected memory element MC (00), the majority charge carriers (holes) of a conductivity type (second conductivity type), which is different from the conductivity type (first conductivity type) of the drain region D and source region S, are injected into the channel of the MONOS transistor making up the unselected memory element MC (11) classified as an erroneously-erasable memory element EPS. In the first to fourth embodiments, the majority charge carriers (electrons) of the conductivity type (first conductivity type) of the drain region D and source region S are injected into the channel of the unselected memory element MC (11) classified as the erroneously-erasable memory element EPS during the write operation on the selected memory element. This causes the charge (holes) accumulated at the channel interface of the MONOS transistor making up the unselected memory element MC (11) to recombine with the injected charge (electrons), thereby being able to prevent the unselected memory element MC (11) from changing its state.

The flash memory FLH can be erased as well as written and read. In the first to fourth embodiments described using an N-channel MONOS transistor as an example of a MONOS transistor of the memory element, the write operation is implemented by injecting and storing electrons in the charge storage layer of the MONOS transistor. According to the description, performing the write operation brings the threshold voltage of the MONOS transistor to a high level. On the contrary, the erase operation involves injection of holes into the charge storage layer of the MONOS transistor, and brings the threshold voltage to a low level.

This erase operation is initiated by, for example, specifying an erase operation mode for the flash memory FLH with an address signal Add and input data DI shown in FIGS. 1 and 9. In the erase operation mode, after a memory element (or some memory elements) is selected from a plurality of memory elements arranged in a matrix, for example, a negative word line selective voltage is applied to a selected word line coupled to the selected memory element, and a positive bit line selective voltage and a positive source line selective voltage are applied to a selected bit line and selected source line coupled to the selected memory element. This application of voltage causes holes to be injected into a charge storage layer of a MONOS transistor of the selected memory element, thereby lowering the threshold voltage.

In the first to fourth embodiments, while a write operation is performed on the MONOS transistor of the selected memory element MC (00), majority charge carriers (electrons) having the conductivity type (first conductivity type) of the drain region D and source region S are injected into the channel of the MONOS transistor of the unselected memory element MC (11) as shown in FIG. 3B. This injection allows majority charge carriers (holes) of the second conductivity type accumulated in the channel to recombine with the majority charge carriers (electrons) of the first conductivity type, thereby reducing the majority charge carriers of the second conductivity type accumulated at the channel interface.

In the case where a P-type MONOS transistor is used, electrons, which are the majority charge carriers of the first conductivity type, are stored in the channel of the P-type MONOS transistor making up the unselected memory element MC (11) during a write operation performed on the selected memory element MC (00). Because of this, while the selected memory element MC (00) is being written, a word line non-selective voltage and a bit line non-selective voltage or/and source line non-selective voltage that reduce the potential difference between the unselected word line WL (1) and the unselected bit line BL (1) or/and unselected source line SL (1) are produced and applied to the unselected word line WL (1) and unselected bit line BL (1) or/and unselected source line SL (1). Through the voltage application, holes, which are the majority charge carriers of the second conductivity type, are injected into the channel of the P-type MONOS transistor. Consequently, the electrons stored in the channel can be reduced.

In the first to fourth embodiments, the semiconductor region SOI1 where the channel is formed (FIG. 3) and the gate electrode G are configured to have different work functions, and therefore a potential difference is substantially created between the channel and gate electrode G even if voltages are produced and applied so as to equalize the voltages on the unselected word line WL (1) and the unselected bit line BL (1) or/and unselected source line SL (1).

However, it is possible to produce and apply a word line non-selective voltage and a bit line non-selective voltage or/and source line non-selective voltage such that a potential difference is created between the unselected word line WL (1) and the unselected bit line BL (1) or/and unselected source line SL (1). For example, if an N-channel MONOS transistor is used, a word line non-selective voltage that is positive with respect to the bit line non-selective voltage or/and source line non-selective voltage can be produced and applied in the periods T2, T4, T6, T8, T10 shown in FIGS. 4, 6, 7, and 8. If a P-channel MONOS transistor is used, on the other hand, a word line non-selective voltage that is negative with respect to the bit line non-selective voltage or/and source line non-selective voltage can be produced and applied in the periods T2, T4, T6, T8, T10 shown in FIGS. 4, 6, 7, and 8.

In the first to fourth embodiments, each of the periods T1, T3, T5, T7, T9 shown in FIGS. 4, 6, 7, and 8 is set to a length of time in which the hole concentration at the channel interface is maintained such that ejection of electrons from or injection of holes into the charge storage layer N of the unselected memory element classified as the erroneously-erasable memory element EPS does not occur. For example, each of the periods T1, T3, T5, T7, T9 is set to approximately from a few microseconds (us) to a few tens of microseconds (us).

In addition, each of the periods T2, T4, T6, T8, T10 shown in FIGS. 4, 6, 7, and 8 is set to be longer than a length of time required for the holes stored at the channel interface of the unselected memory element classified as the erroneously-erasable memory element EPS to recombine with the injected electrons. For example, each of the periods T2, T4, T6, T8, T10 is set to approximately from a few microseconds (us) to a few tens of microseconds (us).

The first to fourth embodiments describe that the word line selective voltage, word line non-selective voltage, bit line selective voltage, bit line non-selective voltage, source line selective voltage, source line non-selective voltage, and back gate voltage periodically change; however, the periodicity described herein does not require that the voltages should always behave the same in each of the periods T1 to T10. Thus, the periodicity includes that the voltage value alternately changes.

In the first embodiment, the word line selective voltage, bit line selective voltage, and source line selective voltage periodically change independently, and consequently, the potential difference between the word line selective voltage and the bit line selective voltage and source line selective voltage periodically changes. In the same manner, the word line non-selective voltage, bit line non-selective voltage, and source line non-selective voltage periodically change independently, and consequently, the potential difference between the word line non-selective voltage and the bit line non-selective voltage and source line non-selective voltage periodically changes. The potential difference between the selective voltages and the potential difference between the non-selective voltages increase in the period T1, but decrease in the period T2 as seen in FIG. 4. Thus, it can be assumed that the potential difference periodically changes. In this case, while the potential difference between the selective voltages is small, the potential difference between the non-selective voltages is also small.

In the second embodiment, as shown in FIG. 6, the bit line non-selective voltage and source line non-selective voltage periodically change independently. Accordingly, the potential difference between the word line non-selective voltage and the bit line non-selective voltage and source line non-selective voltage periodically changes. In FIG. 6, the potential difference between the non-selective voltages is large in the period T1, and is small in the period T2.

In the third embodiment, the bit line non-selective voltage or source line non-selective voltage periodically changes, and consequently, the potential difference between the word line non-selective voltage and the bit line non-selective voltage (or the source line non-selective voltage) periodically changes. In the example of FIG. 7, the potential difference between the non-selective voltages is large in the period T1, and is small in the period T2. Furthermore, in the fourth embodiment, the word line non-selective voltage periodically changes, and consequently, the potential difference between the word line non-selective voltage and the source line non-selective voltage periodically changes. Also as shown in FIG. 8, the potential difference between the non-selective voltages is large in the period T1, and is small in the period T2.

The row decoder circuit 8, column decoder circuits 10, 13 shown in FIG. 1 can be assumed as a selection circuit to select a word line, bit line, and source line. In addition, the word line bias control circuit 9, bit line bias control circuit 11, source line bias control circuit 14 can be assumed as a bias circuit to produce a selective voltage and non-selective voltage.

Under the assumption, it can be assumed that the bias circuit periodically changes the potential difference between the selective voltages (large or small). Similarly, it can be assumed that the bias circuit periodically changes the potential difference between the non-selective voltages (large or small).

Moreover, although word lines are arranged along respective rows in a matrix, and bit lines and source lines are arranged along respective columns in the matrix in the first to fourth embodiments, the embodiments are not limited thereto. For example, the word lines can be arranged along the respective columns in the matrix, and the bit lines and source lines can be arranged along the respective rows in the matrix. Although a common back gate voltage is applied to a plurality of back gate lines BKL, this is just an example, and it is also possible to select a desired back gate line from the back gate lines BKL and apply a back gate voltage to the selected back gate line. The threshold voltage of the memory elements can be adjusted by changing the back gate voltage.

It should be further understood by those skilled in the art that although the foregoing description has been made on embodiments of the invention, the invention is not limited thereto and various changes and modifications may be made without departing from the spirit of the invention and the scope of the appended claims. For example, the present invention has been described in terms of a flash memory including memory elements as an example; however, the invention is not limited thereto, and can be also applied to other types of nonvolatile memories composed of memory elements, such as EEPROM.

What is claimed is:
1. A semiconductor device comprising:
a plurality of nonvolatile memory elements, each of which has a pair of second semiconductor regions arranged to sandwich a first semiconductor region where a channel is formed, the second semiconductor regions being of a first conductivity type, a gate electrode arranged above the first semiconductor region, and a charge storage layer arranged between the gate electrode and the first semiconductor region and storing charge, and the memory elements being arranged over a semiconductor substrate with an insulating layer interposed therebetween; and
a bias circuit producing a selective voltage to be applied to a first nonvolatile memory element of the nonvolatile memory elements and a nonselective voltage to be applied to a second nonvolatile memory element of the nonvolatile memory elements such that when majority charge carriers of the first conductivity type of the second semiconductor region are stored in the charge storage layer of the first nonvolatile memory element and the selective voltage is applied to the first nonvolatile memory element, the bias circuit produces the nonselective voltage to be applied to the second nonvolatile memory element that reduces a potential difference between the gate electrode and at least one of the second semiconductor regions of the second nonvolatile memory element, which is different from the first nonvolatile memory element, to thereby reduce majority charge carriers of a second conductivity type of the first semiconductor region, which is different from the first conductivity type, stored in the channel of the second nonvolatile memory element.
2. The semiconductor device according to claim 1,
wherein the bias circuit applies a potential difference between the gate electrode of the second nonvolatile memory element and the second semiconductor region such that the majority charge carriers of the first conductivity type of the second semiconductor region are supplied to the channel of the second nonvolatile memory element, to recombine the stored majority charge carriers of the second conductivity type of the first semiconductor region with the supplied majority charge carriers of the first conductivity type of the second semiconductor region in the channel of the second nonvolatile memory element.
3. The semiconductor device according to claim 2,
wherein the gate electrode of the nonvolatile memory elements includes a semiconductor layer of the first conductivity type, and the bias circuit equalizes a voltage on the gate electrode of the second nonvolatile memory element and a voltage on the second semiconductor region.
4. The semiconductor device according to claim 3,
wherein the first semiconductor region includes a P-type semiconductor region, the pair of the second semiconductor regions include a pair of N-type semiconductor regions, the majority charge carriers of the first conductivity type are electrons, and the majority charge carriers of the second conductivity type are holes.
5. The semiconductor device according to claim 1,
wherein the first semiconductor region is in an electrically floating state, a bias voltage is applied to the semicon- ductor substrate, and the bias voltage adjusts a threshold voltage of the nonvolatile memory elements.

6. A semiconductor device comprising:
a plurality of nonvolatile memory elements, each of which has a pair of second semiconductor regions arranged to sandwich a first semiconductor region where a channel is formed, the second semiconductor regions being of a first conductivity type, a gate electrode arranged above the first semiconductor region, and a charge storage layer arranged between the gate electrode and the first semiconductor region and storing charge, and the memory elements being arranged in a matrix over a semiconductor substrate with an insulating layer interposed therebetween;
a plurality of word lines arranged along respective rows in the matrix, and coupled to the gate electrode of the nonvolatile memory elements arranged in the corresponding rows;
a plurality of bit lines arranged along respective columns in the matrix, and coupled to one of the second semiconductor regions of the nonvolatile memory elements arranged in the corresponding columns;
a plurality of source lines arranged along the respective columns in the matrix, and coupled to the other second semiconductor region of the nonvolatile memory elements arranged in the corresponding columns;
a selection circuit selecting a word line, a bit line, and a source line from the word lines, the bit lines, and the source lines; and
a bias circuit producing a selective voltage to be applied to the selected word line, the selected bit line, and the selected source line, and a non-selective voltage to be applied to an unselected word line, an unselected bit line, and an unselected source line, and
wherein, while majority charge carriers of the first conductivity type are being stored in the charge storage layer of a first nonvolatile memory element including a gate electrode coupled to the selected word line, one of the second semiconductor regions coupled to the selected bit line, and the other second semiconductor region coupled to the selected source line, the bias circuit produces a non-selective voltage to supply majority charge carriers of the first conductivity type of the second semiconductor region to the channel of a second nonvolatile memory element including a gate electrode coupled to the unselected word line, one of the second semiconductor regions coupled to the unselected bit line, and the other second semiconductor region coupled to the unselected source line.

7. The semiconductor device according to claim 6,
wherein, while the majority charge carriers of the first conductivity type of the second semiconductor region are being stored in the charge storage layer of the first nonvolatile memory element, the bias circuit produces a selective voltage that periodically changes the potential difference and a non-selective voltage that periodically changes the potential difference.

8. The semiconductor device according to claim 7,
wherein, when the majority charge carriers of the first conductivity type of the second semiconductor region are supplied to the channel of the second nonvolatile memory element, the bias circuit equalizes the value of a selective voltage to be applied to the selected word line, the selected bit line, and the selected source line and the value of a non-selective voltage to be applied to the unselected word line, unselected bit line, and unselected source line.

9. The semiconductor device according to claim 6,
wherein the bias circuit produces a non-selective voltage that periodically changes the potential difference in a period in which the bias circuit produces a selective voltage to store the majority charge carriers of the first conductivity type of the second semiconductor region in the charge storage layer of the first nonvolatile memory element.

10. The semiconductor device according to claim 9,
wherein the bias circuit produces a non-selective voltage that periodically reduces the potential difference between a non-selective voltage applied to the unselected word line and a non-selective voltage applied to the unselected bit line, in a period in which the majority charge carriers of the first conductivity type of the second semiconductor region are being stored in the charge storage layer of the first nonvolatile memory element.

11. The semiconductor device according to claim 9,
wherein the bias circuit produces a non-selective voltage that periodically reduces the potential difference between a non-selective voltage applied to the unselected word line and a non-selective voltage applied to the unselected source line in a period in which the majority charge carriers of the first conductivity type of the second semiconductor region are being stored in the charge storage layer of the first nonvolatile memory element.

12. The semiconductor device according to claim 9,
wherein the bias circuit produces a non-selective voltage that periodically reduces the potential difference between a non-selective voltage applied to the unselected word line and a non-selective voltage applied to the unselected bit line and the potential difference between a non-selective voltage applied to the unselected word line and a non-selective voltage applied to the unselected source line in a period in which the majority charge carriers of the first conductivity type of the second semiconductor region are being stored in the charge storage layer of the first nonvolatile memory element.

13. The semiconductor device according to claim 9,
wherein the first semiconductor region of the nonvolatile memory elements is in a floating state, and a bias voltage is applied to the semiconductor substrate to adjust a threshold voltage of the nonvolatile memory elements.

14. A semiconductor device comprising:
a plurality of nonvolatile memory elements, each of which has a first semiconductor region where a channel is formed and being in an electrically floating state, a pair of second semiconductor regions arranged to sandwich the first semiconductor region, the second semiconductor regions being of a first conductivity type, a gate electrode arranged above the first semiconductor region, and a charge storage layer arranged between the gate electrode and the first semiconductor region and storing charge; and
a bias circuit producing a selective voltage to be applied to a first nonvolatile memory element of the nonvolatile memory elements and a nonselective voltage to be applied to a second nonvolatile memory element of the nonvolatile memory elements such that when majority charge carriers of the first conductivity type of the second semiconductor region are stored in the charge storage layer of the first nonvolatile memory element and the selective voltage is applied to the first nonvolatile memory element, the bias circuit periodically produces the nonselective voltage to the second nonvolatile memory element that periodically reduces a potential difference between the gate electrode and at least one of the second semiconductor regions of the second nonvolatile memory element, which is different from the first nonvolatile memory element, to periodically supply majority charge carriers of the first conductivity type of the second semiconductor region to the channel of the second nonvolatile memory element to thereby reduce majority charge carriers of a second conductivity type of the first semiconductor region, which is different from the first conductivity type, stored in the channel of the second nonvolatile memory element.

15. The semiconductor device according to claim 14, wherein the gate electrode of the nonvolatile memory elements includes a semiconductor layer of the first conductivity type, and the bias circuit equalizes a voltage to be applied to the gate electrode of the second nonvolatile memory element and a voltage to be applied to the second semiconductor region.

16. The semiconductor device according to claim 15, wherein the first semiconductor region includes a P-type semiconductor region, the pair of the second semiconductor regions include a pair of N-type semiconductor regions, the majority charge carriers of the first conductivity type are electrons, and the majority charge carriers of the second conductivity type are holes.

* * * * *